United States Patent
Hirano et al.

(10) Patent No.: US 7,038,951 B2
(45) Date of Patent: May 2, 2006

(54) NON-VOLATILE SEMICONDUCTOR MEMORY DEVICE AND ERASING CONTROL METHOD THEREOF

(75) Inventors: Yasuaki Hirano, Tenri (JP); Shuichiro Kouchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/866,442

(22) Filed: Jun. 10, 2004

(65) Prior Publication Data

US 2004/0264253 A1    Dec. 30, 2004

(30) Foreign Application Priority Data

Jun. 12, 2003   (JP)  ............................. 2003-168430

(51) Int. Cl.
*G11C 16/04* (2006.01)

(52) U.S. Cl. ............................. 365/185.29; 365/185.11

(58) Field of Classification Search ........... 365/185.29, 365/185.22, 185.24, 185.2, 185.19, 185.11
See application file for complete search history.

(56) References Cited

U.S. PATENT DOCUMENTS 6,457,126 B1 *   9/2002   Nakamura et al. ........... 713/166
6,542,410 B1 *   4/2003   Hirano ..................... 365/185.3

FOREIGN PATENT DOCUMENTS

JP          09-320282          12/1997

* cited by examiner

*Primary Examiner*—Thong Q. Le
(74) *Attorney, Agent, or Firm*—Morrison & Foerster LLP

(57) ABSTRACT

A non-volatile semiconductor memory device includes a memory cell array including a plurality of memory cells, wherein information is writable to each of the plurality of memory cells and information is erasable from each of the plurality of memory cells, and the plurality of memory cells are grouped into at least one memory block; and a write and erasing section for performing a program write operation to a prescribed memory cell in one memory block in a prescribed voltage condition and for performing an erasing operation with respect to the memory cells in the one memory block, wherein the write and erasing section performs a pre-erasing write operation to the memory cells in the one memory block in a voltage condition, which is different from the prescribed voltage condition, before the erasing operation is performed with respect to the memory cells in the one memory block.

22 Claims, 25 Drawing Sheets

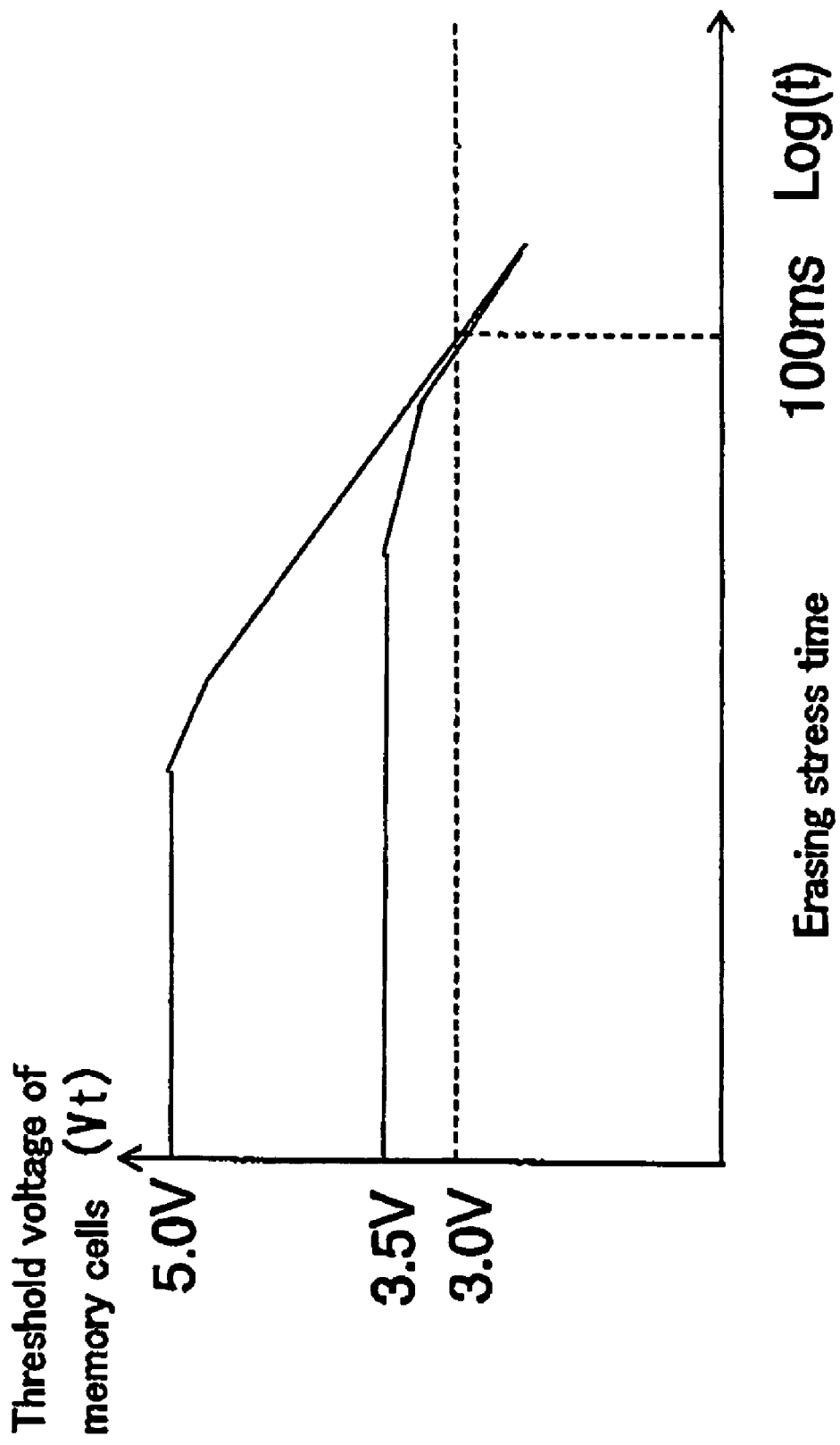

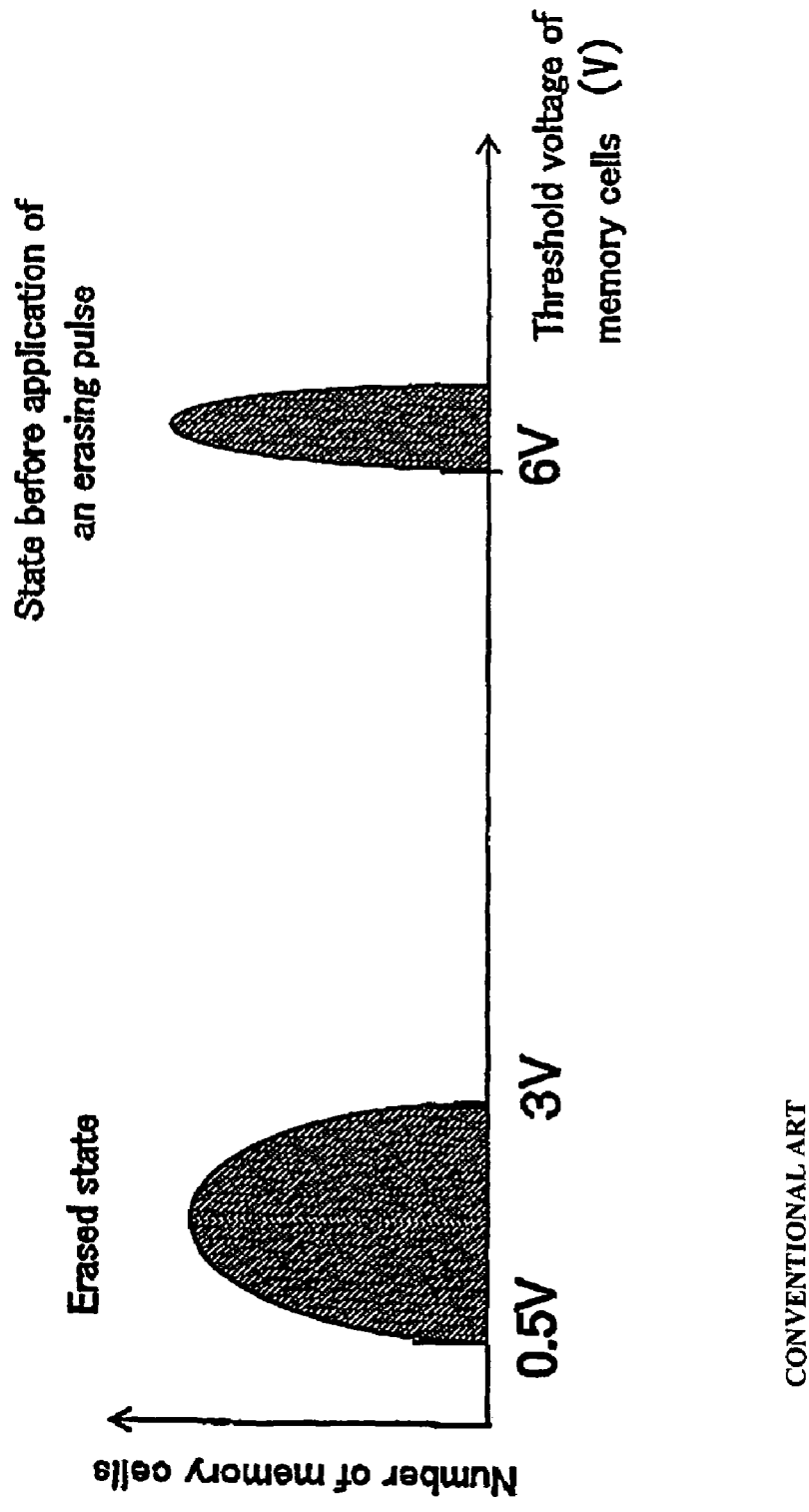

NON-VOLATILE SEMICONDUCTOR MEMORY DEVICE AND ERASING CONTROL METHOD THEREOF

This non-provisional application claims priority under 35 U.S.C., §119(a), on Patent Application No. 2003-168430 filed in Japan on Jun. 12, 2003, the entire contents of which are hereby incorporated by reference.

BACKGROUND OF THE INVENTION

1. Field of the Invention

The present invention relates to a non-volatile semiconductor memory device and an erasing control method thereof, and in particular to a non-volatile semiconductor memory device including a plurality of memories to which information is writable and from which information is erasable, and an erasing control method thereof.

2. Description of the Related Art

Conventionally, ETOX (EPROM Thin Oxide (registered trademark of Intel Corporation)) type flash memories are most commonly used as a flash memory as an example of a non-volatile semiconductor memory device.

FIG. 16 is a schematic cross-sectional view of one of a plurality of memory cells 150 in a conventional ETOX type flash memory.

The ETOX flash memory mainly performs a read operation, a program write operation, and an erasing process including an erasing operation and a pre-erasing write operation. In the read operation, a read procedure is performed. In the program write operation, a program write procedure and a program write verification procedure are performed. In the erasing operation, an erasing procedure and an erasing verification procedure are performed. In the pre-erasing write operation, a pre-erasing write procedure and a pre-erasing write verification procedure are performed.

Each memory cell 150 has the following structure. In a surface area of a semiconductor substrate 151, a source region 152 acting as one of two driving terminals and a drain region 153 acting as the other driving terminal are provided with a prescribed interval therebetween. A region in the semiconductor substrate 151 between the source region 152 and the drain region 153 acts as a channel region 151a. A tunnel oxide layer 154, a floating gate 155, an interlayer insulating layer 156, and a control gate 157 acting as a control terminal are provided sequentially in this order on the channel region 151a of the semiconductor substrate 151 so as to cover edges of the source region 152 and the drain region 153.

Next, an operating principle of such a conventional ETOX type flash memory will be described.

Table 1 shows the voltages applied in the program write procedure, the erasing procedure, and the read procedure of the conventional ETOX type flash memory. The voltages shown in Table 1 are used when a source erasing method (described below) is used.

TABLE 1

|  | Control gate | Drain | Source | Substrate |
|---|---|---|---|---|
| Program write | 9 V | 5 V/0 V or Open | 0 V | 0 V |
| Erasing | −9 V | Open | 5 V | 0 V |
| Read | 5 V | 1 V | 0 V | 0 V |

As shown in Table 1, in the program write procedure, a program write voltage Vpp of 9 V is applied to the control gate 157, a reference voltage Vss of 0 V is applied to the source region 152 and the semiconductor substrate 151, and a voltage of 5 V is applied to the drain region 153.

At this point, a large magnitude of current flows in the channel region 151a between the source region 152 and the drain region 153, and hot electrons are generated in a portion in the channel region 151a closer to the drain region 153 where the level of the electric field is high. This causes electrons to be injected into the floating gate 155 of the memory cell 150, which places the memory cell 150 into a program written state. As a result, the threshold voltage of the memory cell 150 is increased. The drain region 153 of the memory cell 150 to which no writing is to be performed is supplied with 0 V or placed into an open state.

FIG. 17 is a graph illustrating a distribution of the threshold voltages of the memory cells 150 provided in a conventional binary flash memory. In FIG. 17, the horizontal axis represents the threshold voltage of the memory cells 150, and the vertical axis represents the number of memory cells 150.

Usually in a binary flash memory, the state in which electrons are injected into the floating gate 155 of the memory cell 150 is a program written state, where data is "0". In this example, the threshold voltages of the memory cells 150 to which writing has been performed are distributed over a range higher than 5 V.

The state where electrons are pulled out from the floating gate 155 of the memory cell 150 is an erased state, where data is "1". In this example, the threshold voltages of the memory cells 150 from which data has been erased are distributed over a range of 0.5 V to 3 V.

When the threshold voltage of the memory cell 150 increases to a prescribed level (5 V in this example) or higher, the program write operation is terminated. When the threshold voltage of the memory cell 150 decreases to a prescribed level (3 V in this example) or lower, the erasing operation is terminated.

In the erasing procedure, a voltage of Vnn of −9 V is applied to the control gate 157, a voltage Vpe of 6 V (or 5 V) is applied to the source region 152, a reference voltage Vss of 0 V is applied to the semiconductor substrate 151, and the drain region 153 is placed into an open state. This causes electrons to be pulled out from the floating gate 155 via the tunnel oxide layer 154 in a portion of the channel region 151a closer to the source region 152. As a result, the threshold voltage of the memory cell 150 is decreased. This erasing method is referred to as a "source erasing" method. The distribution of the threshold voltages of the memory cells 150 in this case is similar to that of the data "1" state (erased state) in FIG. 17.

While the erasing procedure is performed, a BTBT (Band To Band Tunneling) current flows between the source region 152 and the semiconductor substrate 151. When the BTBT current is generated, hot holes and hot electrons are both generated. The hot electrons flow to the drain region 153, while the hot holes are attracted toward, and are trapped in, the tunnel oxide layer 154. It is considered that the phenomenon that hot holes are trapped in the tunnel oxide layer 154 deteriorates the reliability of data storage.

One technique to solve this drawback is a data erasing method, which is also referred to as a channel erasing method. Table 2 shows the voltages applied in the program write procedure, the erasing procedure, the read procedure, and the pre-erasing write procedure of the conventional ETOX type flash memory when the channel erasing method is used.

TABLE 2

|  | Control gate | Drain | Source | Substrate |
|---|---|---|---|---|
| Program write | 9 V | 5 V/0 V or Open | 0 V | 0 V |
| Erasing | –9 V | Open | Open | 6 V |
| Read | 5 V | 1 V | 0 V | 0 V |
| Pre-erasing write | 9 V | 5 V/0 V or Open | 0 V | 0 V |

As shown in Table 2, in the erasing procedure, a voltage Vnn of –9 V is applied to the control gate 157, a voltage Vpe of 5 V (or 6 V) is applied to the channel region 151a (substrate), and the source region 152 and the drain region 153 are placed into an open state. This causes electrons to be pulled out from the floating gate 155 via the tunnel oxide layer 154 in a portion of the channel region 151a closer to the source region 152. As a result, the threshold voltage of the memory cell 150 is decreased. The distribution of the threshold voltages of the memory cells 150 in this case is similar to that of the data "1" state (erased state) in FIG 17. With the channel erasing method, the program write procedure and the read procedure use substantially the same voltages as those for the source erasing method shown in Table 1.

In the read procedure, 1 V to applied to the drain region 153, 5 V is applied to the control gate 157, and a reference voltage Vss of 0 V is applied to the semiconductor substrate 151 and the source region 152. When the memory cell 150 is in the erased state and thus the threshold voltage is low, a current flows in the memory cell 150. Therefore, the memory cell 150 is determined to be in the data "1" state shown in FIG. 17. When the memory cell 150 is in the program written state and thus the threshold voltage is high, no current flows in the memory cell 150. Therefore, the memory cell 150 is determined to be in the data "0" state shown in FIG. 17. Whether the memory cell 150 is in the data "1" state or in the data "0" state is determined as follows. A potential corresponding to the magnitude of the current flowing in the memory cell from which data is to be read, and a potential corresponding to the magnitude of the current flowing in a reference cell, are detected and compared by a sense amplifier. The reference cell is provided separately from the memory cell in the memory cell array and has a prescribed reference threshold voltage set therein.

Next, a sequence of an erasing process in the conventional binary flash memory will be described.

FIG. 18 in a flowchart illustrating an erasing process algorithm regarding the sequence of the erasing process in the conventional binary flash memory.

As shown in FIG. 17, the threshold voltages of the memory cells in a memory block before the erasing process are one of the two states mentioned above, i.e., the state of 0.5 V to 3 V and the state of 5 V or higher.

As shown in FIG. 18, the erasing process starts with the pre-erasing write procedure in step S1, which is performed in order to prevent excessive erasing. The pre-erasing write procedure is disclosed by, for example, Japanese Laid-Open Publication No. 9-320282. For the pre-erasing write procedure, the voltages shown in Table 2 are used. The gate voltage Vg is 9 V. The voltages for the pre-erasing write procedure are the same as those of the program write procedure. The pre-erasing write procedure is performed on all the memory cells in the memory block.

Next, in step S2, the pre-erasing write verification procedure is performed. In this procedure, a reference voltage of 5 V is used as shown in Table 3. Therefore, the pre-erasing write operation, including the pre-erasing write procedure and the pre-erasing write verification procedure, is performed until the threshold voltages of all the memory cells in the memory block become 5 V or higher.

TABLE 3

| Procedure | Reference voltage |
|---|---|
| Program write | 5 V |
| Pre-erasing write | 5 V |

When it is determined in step S3 that all the memory cells in the memory block have a threshold voltage of 5 V or higher, the pre-erasing write procedure and the pre-erasing write verification procedure are terminated.

In step S4, the erasing procedure is performed by applying an erasing pulse to all the memory cells of the memory block with the voltages shown in Table 2.

In step S5, the erasing verification procedure is performed. The reference voltage used in this procedure is 3 V in the case of FIG. 17. Therefore, the erasing procedure and the erasing verification procedure are repeated until the threshold voltages of all the memory cells in the memory block become 3 V or lower.

When it is determined in step S6 that the threshold voltages of all the memory cells in the memory block become 3 V or lower, the erasing procedure and the erasing verification procedure are terminated.

In step S7, it is checked by a software program whether or not there is a memory cell having a threshold voltage of 0.5 V or lower. When there is such a memory cell, that memory cell is adjusted to have a threshold voltage of 0.5 V or higher and 3 V or lower. The threshold voltage of the memory cell is thus controlled by the software program, and then the erasing process is terminated.

The above-described conventional erasing method has a problem in reliability of the flash memory, which is caused by the hot holes being trapped in the tunnel oxide layer as described above. This will be described in detail below.

One cause of deterioration of the reliability of the flash memory is an electric field stress on an oxide layer (e.g., the tunnel oxide layer 154) which is generated during the erasing operation. By the conventional erasing method, the threshold voltages before the erasing operation is 5 V or higher due to the pre-erasing write operation.

Assuming that the charge amount Qfg of the floating gate 155 is –1.2 V, the floating gate voltage Vfg is:

$$Vfg = Cg \times Vg + Cw \times Vwell - Qfg$$

where Vfg: floating gate voltage;

Vg: control gate voltage;

Vwell: well voltage;

Cg: gate coupling ratio;

Cw: well coupling ratio; and

Qfg: charge amount of the floating gate.

Therefore, the voltage Vfg of the floating gate 155 is:

$$0.6 \times (-9\ V) + 0.2 \times (6\ V) - 1.2\ V = -5.4\ V.$$

The electric field Eox which is applied to the tunnel oxide layer 154 is:

$$Eox = (Vwell - Vfg)/Tox$$
$$= (6 - (-5.4))/(100E - 8) = 11.4 \text{ MeV}.$$

where Eox: electric field applied to the tunnel oxide layer; and

Tox: thickness of the tunnel oxide layer.

Such an electric field stress on the tunnel oxide layer 154 is applied to all the memory cells in the memory block each time an erasing pulse is applied for the erasing procedure. As a result, holes and electrons are trapped in the tunnel oxide layer 154, which deteriorates the data retention. The strength of the data retention can be dealt using probability as reported by IEEE 40th Annual International Reliability Physics Symposium 2002, pages 7–20. As the number of memory cells receiving the electric field stress is smaller, the reliability regarding the data retention of the entire memory block and thus of the entire chip is improved.

As the memory cells, multiple bit memory cells to which 2- or more bit information is writable are known in addition to the binary memory bit to which binary (i.e., 1-bit) information is writable.

FIG. 19 is a graph illustrating the distribution of the threshold voltages of the memory cells in a conventional multiple bit flash memory. In FIG. 19, the vertical axis represents the number of memory cells, and the horizontal axis represents the threshold voltage of the memory cells.

As shown in FIG. 19, the threshold voltages of the memory cells in the memory block before the erasing operation are one of the four states, i.e., erased state (the threshold voltages are 3.0 V or lower), written state VtL (the threshold voltages are in the range of 4.0 V to 4.4 V), written state VtM (the threshold voltages are in the range of 5.0 V to 5.4 V), and written state VtH (the threshold voltages are in the range of 6.0 V to 6.4 V).

Next, an erasing algorithm of a sequence of an erasing process of a conventional quaternary flash memory will be described in detail.

FIG. 20 is a flowchart illustrating the erasing algorithm of the sequence of the erasing process of the conventional quaternary flash memory.

As shown in FIG. 20, the erasing process starts with the pre-erasing write procedure in step S31, which is performed in order to prevent excessive erasing. For the pre-erasing write procedure, the voltages shown in Table 4 ("pre-erasing write"), for example, are used. The gate voltage Vg is 9 V. A same gate voltage is used for the state having the highest threshold voltage and the state having the lowest threshold voltage. The voltages for the pre-erasing write procedure are the same as the voltages for writing information the highest threshold voltage in the program write procedure. The pre-erasing write procedure is performed on all the memory cells in the memory block. Table 4 shows the voltages applied for writing information having the highest threshold voltage in the program write procedure, the erasing procedure, the read procedure, and the pre-erasing write procedure of the conventional multiple bit flash memory when the channel erasing method is used.

TABLE 4

| | Control gate | Drain | Source | Substrate |
|---|---|---|---|---|
| Program write | 6 V–9 V | 5 V/0 V or Open | 0 V | 0 V |
| Erasing | –9 V | Open | Open | 6 V |
| Read | 5 V | 1 V | 0 V | 0 V |
| Pre-erasing write | 9 V | 5 V/0 V or Open | 0 V | 0 V |

Next, in step S32, the verification procedure is performed for verifying the pre-erasing write. Since the reference voltage is 6 V, the above pre-erasing operation is performed until the threshold voltages of all the memory cells in the memory block become 6 V or higher.

After the pre-erasing write operation including the pre-erasing write procedure and the pre-erasing write verification procedure, the threshold voltages of the memory cells in the memory block are distributed in the range of 6 V or higher as shown in FIG. 21.

FIG. 21 is a graph illustrating a distribution of the threshold voltages of the memory cells of a conventional multiple bit flash memory after the pre-erasing write operation.

When it is determined in step S33 that all the memory cells in the memory block have a threshold voltage of 6 V or higher, the pre-erasing write procedure and the pre-erasing write verification procedure are terminated. Then, the erasing procedure is performed by applying an erasing pulse in step S34.

In step S34, an erasing pulse is applied to all the memory cells in the memory block with the voltages shown in Table 4.

Steps S35 through S37 are performed in the same manner as those for the binary flash memory. In step S35, the erasing verification procedure of verifying the erasing is performed. In step S36, it is determined whether or not the threshold voltages of all the memory cells in the memory block are 3 V or lower. The erasing procedure of applying an erasing pulse and the erasing verification procedure are repeated until the threshold voltages of all the memory cells in the memory block become 3 V or lower.

When it is determined in step S36 that the threshold voltages of all the memory cells in the memory block become 3 V or lower, the erasing procedure and the erasing verification procedure are terminated.

In step S37, it is checked by a sequence of software (software program) whether or not there is a memory cell having a threshold voltage of 0.5 V or lower. When there is such a memory cell, that memory cell is adjusted to have a threshold voltage of 0.5 V or higher and 3 V or lower. When the number of the memory cells having a threshold voltage of 0.5 V or lower becomes zero, this sequence is terminated, and the erasing process is terminated.

When an erasing pulse is applied to the memory cells having the distribution shown in FIG. 21 in the above-mentioned conventional erasing process, the charge amount Qfg of the floating gate is –1.8 V. The floating gate voltage Vfg in this case is:

$$0.6 \times (-9V) + 0.2 \times (6V) - 1.8V = -6V.$$

The electric field Eox which is applied to the tunnel oxide layer is:

$$(6V - (-6V))/100 \text{ Å} = 12 \text{ MeV}.$$

According to this conventional art, an electric field of 12 MeV is applied to the tunnel oxide layer of all the memory calls in the memory block, and thus substantially the same electric field stress is applied to the memory cells in the erased state, the written state VtL, the written state VtM, and the written state VtH before the erasing process. This means an excessive stress is applied to at least the memory cells which were in the erased state, the written state VtL, the written state VtM before the erasing process.

SUMMARY OF THE INVENTION

According to one aspect of the invention, a non-volatile semiconductor memory device includes a memory cell array including a plurality of memory cells, wherein information is writable to each of the plurality of memory cells and information is erasable from each of the plurality of memory cells, and the plurality of memory cells are grouped into at least one memory block; and a write and erasing section for performing a program write operation to a prescribed memory cell in one memory block in a prescribed voltage condition and for performing an erasing operation with respect to the memory cells in the one memory block, wherein the write and erasing section performs a pre-erasing write operation to the memory cells in the one memory block in a voltage condition, which is different from the prescribed voltage condition, before the erasing operation is performed with respect to the memory cells in the one memory block.

In one embodiment of the invention, the plurality of memory cells each have a threshold voltage which varies in accordance with the voltage condition. The write and erasing section sets a voltage condition for the pre-erasing write operation, such that the threshold voltages of the memory cells in the one memory block after the pre-erasing write operation are lower than the threshold voltages of the memory cells in the one memory block after the program write operation, and such that excessive erasing does not occur in the memory cells in the one memory block in the erasing operation.

In one embodiment of the invention, the plurality of memory cells each include a control terminal. The write and erasing section sets a voltage condition for the pre-erasing write operation, such that the voltages applied to the control terminals of the memory cells in the one memory block in the pre-erasing write operation are lower than the voltages applied to the control terminals of the memory cells in the one memory block in the program write operation.

In one embodiment of the invention, the write and erasing section performs, in the program write operation, a program write procedure of writing a program and a program write verification procedure of verifying the program write. The write and erasing section performs, in the pre-erasing write operation, a pre-erasing write procedure of performing pre-erasing write and a pre-erasing write verification procedure of verifying the pre-erasing write. The write and erasing section sets a voltage condition for the pre-erasing write operation such that a reference voltage used in the pre-erasing write verification procedure is lower than a reference voltage used in the program write verification procedure.

In one embodiment of the invention, the memory cell array further includes a reference cell. The reference cell includes a control terminal. The write and erasing section includes a reference control line voltage generation circuit for supplying, in the pre-erasing write verification procedure, the control terminal of the reference cell with a reference control line voltage which is different from a voltage used in the program write verification procedure.

In one embodiment of the invention, the memory cell array further includes a reference cell array including a plurality of reference cells. The plurality of reference cells have different reference threshold voltages. The plurality of reference cells each include a control terminal. In the pre-erasing write verification procedure, the reference control line voltage generation circuit supplies the control terminal of a reference cell in the reference cell array, which is the same as a reference cell used in the program write verification procedure, with a reference control line voltage which is different from a reference control line voltage used in the program write verification procedure.

In one embodiment of the invention, the memory cell array further includes a reference cell array including a plurality of reference cells. The plurality of reference cells have different reference threshold voltages. The plurality of reference cells each include a control terminal. In the pre-erasing write verification procedure, the reference control line voltage generation circuit supplies the control terminal of a reference cell in the reference cell array, which is different from the reference cell used in the program write verification procedure, with a reference control line voltage which is different from a reference control line voltage used in the program write verification procedure.

In one embodiment of the invention, the memory cell array further includes a reference cell array including a plurality of reference cells. The plurality of reference cells have different reference threshold voltages. The plurality of reference cells each include a control terminal. In the pre-erasing write verification procedure, the reference control line voltage generation circuit supplies the control terminal of a reference cell in the reference cell array, which is different from a reference cell used in the program write verification procedure, with a reference control line voltage which is the same as a reference control line voltage used in the program write verification procedure.

In one embodiment of the invention, the write and erasing section performs, in the erasing operation, an erasing procedure of performing erasing and an erasing verification procedure of verifying the erasing. The write and erasing section uses, in the erasing verification procedure, a reference voltage which is the same as the reference voltage used in the pre-erasing write verification procedure.

In one embodiment of the invention, multiple bit information of at least 2 bits is writable to each of the plurality of memory cells in the memory cell array and is erasable from each of the plurality of memory cells in the memory cell array.

In one embodiment of the invention, the plurality of memory cells each have a threshold voltage which varies in accordance with the voltage condition. Multiple bit information is written to each of the plurality of memory cells in accordance with the threshold voltage. The write and erasing section sets a voltage condition for the pre-erasing write operation, such that the voltage condition for the pre-erasing write operation is different from a voltage condition for writing information having a highest threshold voltage in the program write operation.

In one embodiment of the invention, the write and erasing section sets a voltage condition for the pre-erasing write operation, such that the threshold voltages of the memory cells in the one memory block after the pre-erasing write operation are lower than the threshold voltages of the memory cells in the one memory block after the information having a highest threshold voltage is written in the program write operation, and such that excessive erasing does not occur in the memory cells in the one memory block in the erasing operation.

In one embodiment of the invention, the plurality of memory cells each include a control terminal. The write and erasing section sets a voltage condition for the pre-erasing write operation, such that the voltages applied to the control terminals of the memory cells in the one memory block in the pre-erasing write operation are lower than the voltages applied to the control terminals of the memory cells in the one memory block for writing information having a highest threshold voltage in the program write operation.

In one embodiment of the invention, the write and erasing section sets the prescribed voltage condition for the program write operation such that a reference voltage used in the pre-erasing write verification procedure is lower than a reference voltage used for writing information having a highest threshold voltage in the program write verification procedure.

According to another aspect of the invention, a erasing control method for a non-volatile semiconductor memory device is provided. The non-volatile semiconductor memory device includes a memory cell array including a plurality of memory cells. The plurality of memory cells are grouped into at least one memory block. The erasing method includes the steps of performing a program write operation to a prescribed memory cell in one memory block in a prescribed voltage condition; performing an erasing operation with respect to the memory cells in the one memory block; and performing a pre-erasing write operation to the memory cells in the one memory block in a voltage condition, which is different from the prescribed voltage condition, before the erasing operation is performed with respect to the memory calls in the one memory block.

In one embodiment of the invention, the step of performing the pre-erasing write operation includes the step of performing the pre-erasing write operation in a voltage condition which is lower than the prescribed voltage condition.

In one embodiment of the invention, the plurality of memory cells each include a control terminal. The step of performing the pre-erasing write operation includes the step of applying voltages, which are lower than the voltages applied in the program write operation, to the control terminals of the memory cells in the one memory block.

In one embodiment of the invention, the step of performing the pre-erasing write operation includes the steps of performing the pre-erasing write procedure to the memory cells in the one memory block; and performing the pre-erasing write verification procedure of verifying the pre-erasing write.

In one embodiment of the invention, the step of performing the pre-erasing write verification procedure includes the step of using a reference voltage which is lower than a reference voltage used in the program write operation.

In one embodiment of the invention, the erasing control method further includes the step of performing the erasing operation with respect to the memory cells in the one memory block by applying erasing pulses to the memory cells in the one memory block.

In one embodiment of the invention, multiple bit information of at least 2 bits is writable to each of the plurality of memory cells in the memory cell array and is erasable from each of the plurality of memory cells in the memory cell array.

In one embodiment of the invention, the plurality of memory cells each include a control terminal. The step of performing the program write operation includes the step of performing a program write procedure and the step of performing a program write verification procedure of verifying the program write. The step of performing the pre-erasing write operation includes the step of performing a pre-erasing write procedure and the step of performing a pre-erasing write verification procedure of verifying the pre-erasing write. The step of performing the pre-erasing write procedure includes the step of applying, to the control terminals of the memory cells in the one memory block, voltages which are lower than the voltages applied to the control terminals of the memory cells in the one memory block for writing information having a highest threshold voltage in the program write procedure. The step of performing the pre-erasing write verification procedure includes the step of using a reference voltage, which is lower than a reference voltage used in the program write verification procedure when information having the highest threshold voltage is written in the program write procedure.

According to the present invention, the voltage condition before the pre-erasing write operation is different from the voltage condition for the program write operation. The non-volatile semiconductor memory device according to the present invention, such as a flash memory, performs writing using channel hot electrons, performs a program write operation and an erasing operation, and especially has a function of performing a pre-erasing write operation before the erasing operation in order to avoid excessive erasing.

For the pre-erasing write operation of such a non-volatile semiconductor memory device, the voltage condition which is different from the voltage condition for the program write operation is set, for the purpose of reducing the electric field stress on the memory cells. Specifically, the voltage condition for the pre-erasing write operation is set such that the threshold voltages of the memory cells are lower than those of the voltage condition for the program write operation. Thus, the electric field stress applied to the tunnel oxide layer in the memory cells during the erasing operation is reduced. For example, the voltage condition for the pre-erasing write operation is set such that the gate voltage (control voltage) is lower than that of the voltage condition for the program write operation. The reference voltage for the pre-erasing write verification procedure is set to be lower than that of the reference voltage for the program write verification procedure. Thus, the electric stress applied to the tunnel oxide layer of the memory cells when an erasing pulse is applied is reduced, and a highly reliable non-volatile semiconductor memory device is provided.

For a non-volatile semiconductor memory device to which multiple bit information of at least 2 bits is writable, the gate voltage (control voltage) for the pre-erasing write procedure is set to be lower than the gate voltage (control voltage) for writing the information having the highest threshold voltage in the program write procedure. The reference voltage for the pre-erasing write verification procedure is also set to be lower than the reference voltage used for writing the information having the highest threshold voltage in the program write verification procedure. In this case also, the electric field stress applied to the tunnel oxide layer of the memory cells when an erasing pulse is applied is reduced, and a highly reliable non-volatile semiconductor memory device is provided.

Thus, the invention described herein makes possible the advantages of providing a non-volatile semiconductor memory device and an erasing control method thereof, by which the electric field stress applied to memory cells during an erasing operation is reduced to improve the reliability.

These and other advantages of the present invention will become apparent to those skilled in the art upon reading and understanding the following detailed description with reference to the accompanying figures.

BRIEF DESCRIPTION OF THE DRAWINGS

FIG. 7 is a graph illustrating the relationship between the erasing stress time and the threshold voltages of the memory cells having the threshold voltages of around 3.5 V to 5.0 V in the flash memory shown in FIG. 1B;

FIG. 21 is a graph illustrating a distribution of the threshold voltages of memory cells in a conventional multiple bit flash memory after the pre-erasing write operation and before an erasing pulse is applied.

DESCRIPTION OF THE PREFERRED EMBODIMENTS

Hereinafter, the present invention will be described by way of illustrative examples with reference to the accompanying drawings.

EXAMPLE 1

Figure 1:
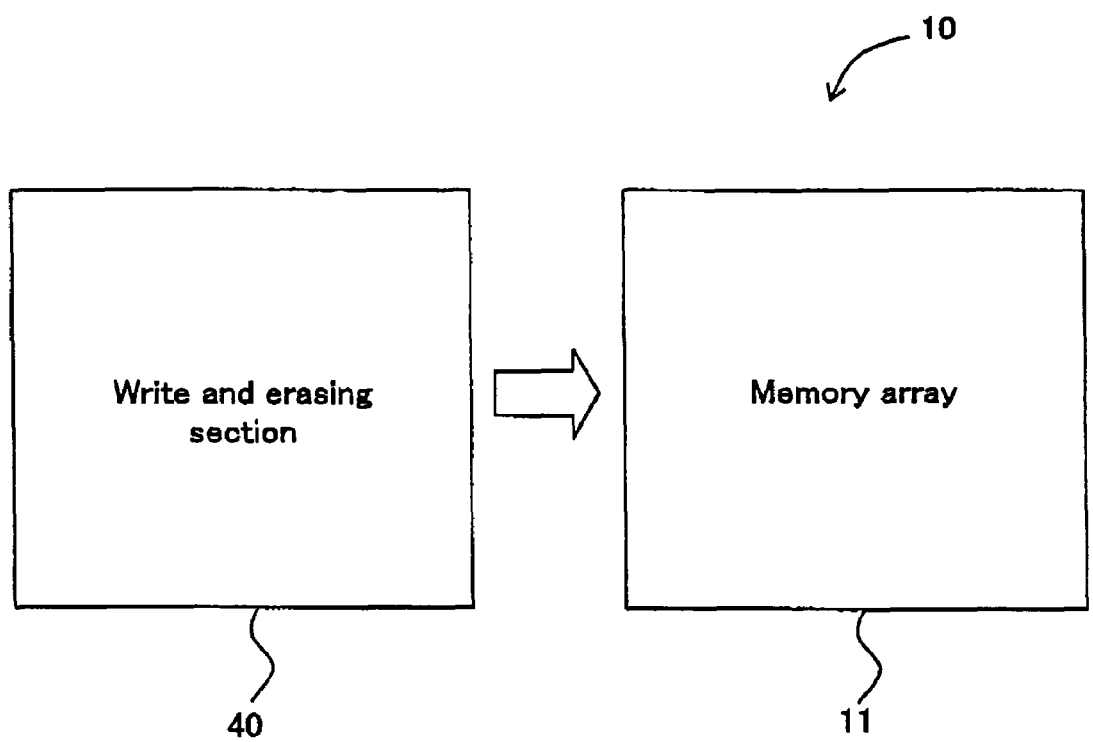
FIG. 1A is a block diagram illustrating a schematic view of a flash memory as an example of a non-volatile semiconductor memory device according to the present invention.
FIG. 1B is a block diagram illustrating a schematic structure of a flash memory according to a first example of the present invention.
FIG. 1C is a schematic cross-sectional view of an ETOX type flash memory according to the present invention.

FIG. 1A is a block diagram illustrating a schematic structure of a flash memory 10 as an example of a non-volatile semiconductor memory device according to the present invention.

The flash memory 10 mainly performs a read operation, a program write operation, and an erasing process including an erasing operation and a pre-erasing write operation.

The flash memory 10 includes a memory cell array 11 including a plurality of memory cells, and a write and erasing section 40 for performing the program write operation for writing data into a memory cell and the erasing process for erasing data from memory cells.

For the program write operation, the write and erasing section 40 performs a program write procedure of writing data to a memory cell and a program write verification procedure of verifying the program write.

For the read operation, the write and erasing section 40 performs a read procedure of reading data from a memory cell.

For the erasing process, the write and erasing section 40 performs the erasing operation and the pre-erasing write operation.

For the erasing operation, the write and erasing section 40 performs an erasing procedure of erasing data from a memory cell and an erasing verification procedure of verifying the erasing. For the pre-erasing write operation, the write and erasing section 40 performs a pre-erasing write procedure of performing pre-erasing write and a pre-erasing write verification procedure of verifying the pre-erasing write.

In the memory cell array 11, the plurality of memory cells are arranged in rows and columns. The memory cells in each row are connected to one word line, and the memory cells in each column are connected to one bit line and one source line.

The plurality of memory cells in the memory array 11 are grouped into a plurality of memory blocks. Data in memory cells in each memory block is erasable at a time. The memory cells in each block are connected to a common source line. In the following description, the source line which is connected to the memory cells in each block will be referred to as a "common source line".

Figure 1B:
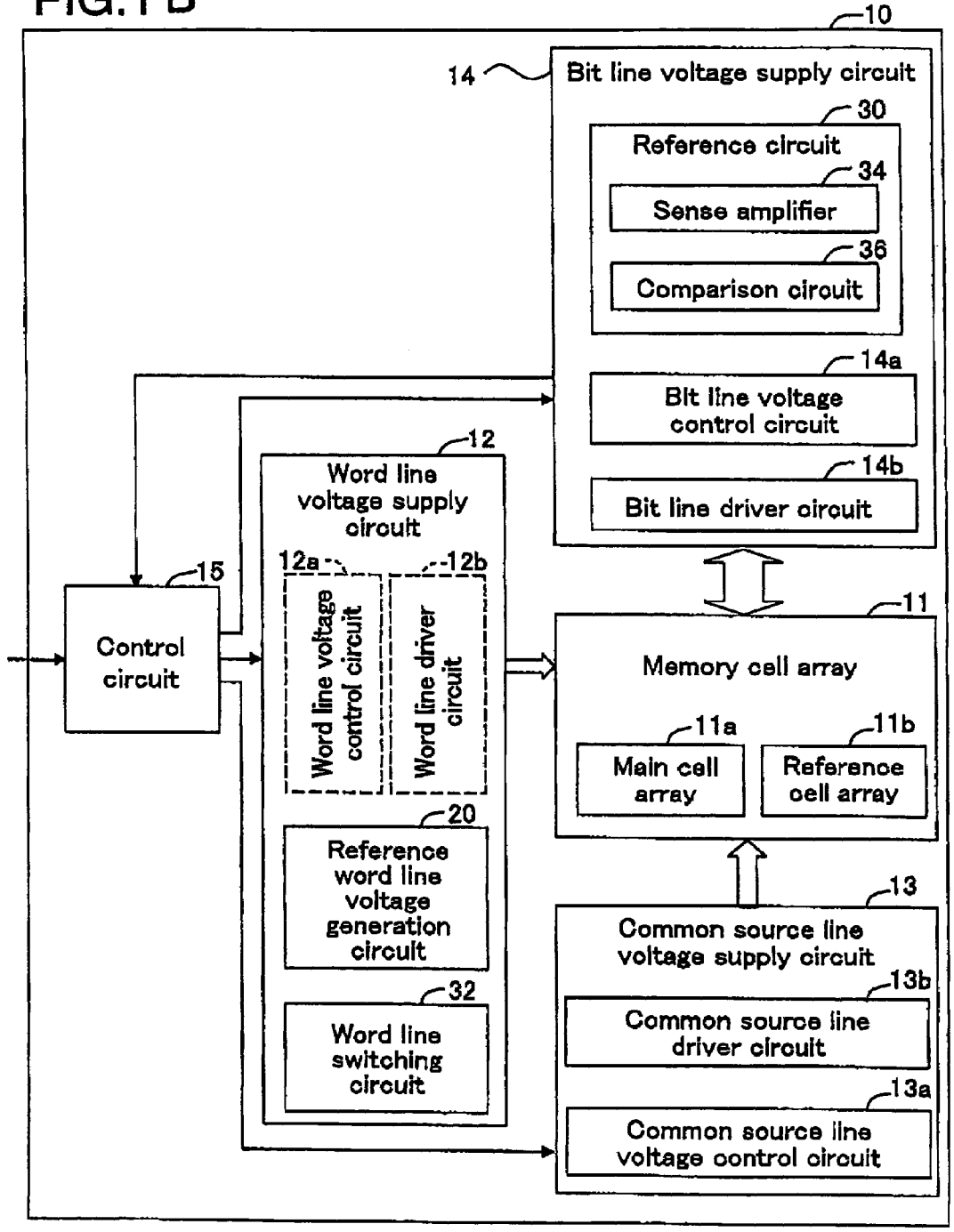

FIG. 1B is a block diagram illustrating a schematic structure of the flash memory 10 in a first example of the present invention.

The memory cell array 11 includes a main cell array 11a acting as a data area for storing data, and a reference cell array 11b acting as a reference area for providing reference to the data stored in the main cell array 11a.

The memory cells in the reference cell array 11b have a prescribed threshold voltage, and will also be referred to as reference cells. In the following description, the memory cells in the main cell array 11a will also be referred to as main memory cells. The reference cells in the reference cell array 11b have substantially the same structure as that of the main memory cells.

The write and erasing section 40 includes a word line voltage supply circuit 12 for supplying a voltage to the word lines, a common source line voltage supply circuit 13 for supplying a voltage to the common source lines, a bit line voltage supply circuit 14 for supplying a voltage to the bit lines, and a control circuit 15.

The control circuit 15 controls the word line voltage supply circuit 12, the common source line voltage supply circuit 13, and the bit line voltage supply circuit 14 by outputting a control signal and an address signal to the word line voltage supply circuit 12, the common source line voltage supply circuit 13, and the bit line voltage supply circuit 14.

The control signal includes a verification control signal veriyen, an erasing control signal erven, a pre-erasing write control signal proven, a program write control signal pven, and a read control signal read.

The word line voltage supply circuit 12 includes a word line voltage control circuit 12a for controlling the voltage of the word lines, a word line driver circuit 12b for selecting a word line and driving the selected word line, a reference word line voltage generation circuit 20 acting as a reference control line voltage generation circuit, and a word line switching circuit 32.

The common source line voltage supply circuit 13 includes a common source line voltage control circuit 13a for controlling the voltage of the common source lines, and a common source line driver circuit 13b for selecting a common source line and driving the selected common source line.

The bit line voltage supply circuit 14 includes a bit line voltage control circuit 14a for controlling the voltage of the bit lines, a bit line driver circuit 14b for selecting a bit line and driving the selected bit line, and a reference circuit 30. The bit line driver circuit 14b also acts as a decoder for decoding an encoded address signal.

The reference circuit 30 includes a sense amplifier 34 and a comparison circuit 36.

Figure 1C:
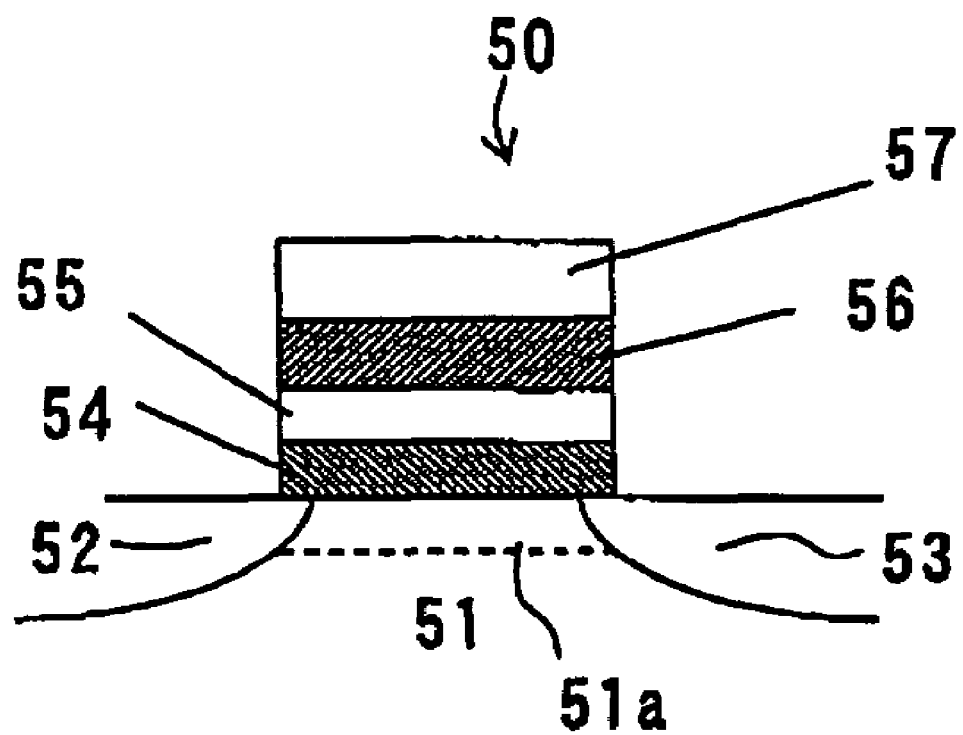

FIG. 1C is a schematic cross-sectional view illustrating one memory cell 50 in the memory cell array 11.

Figure 16:
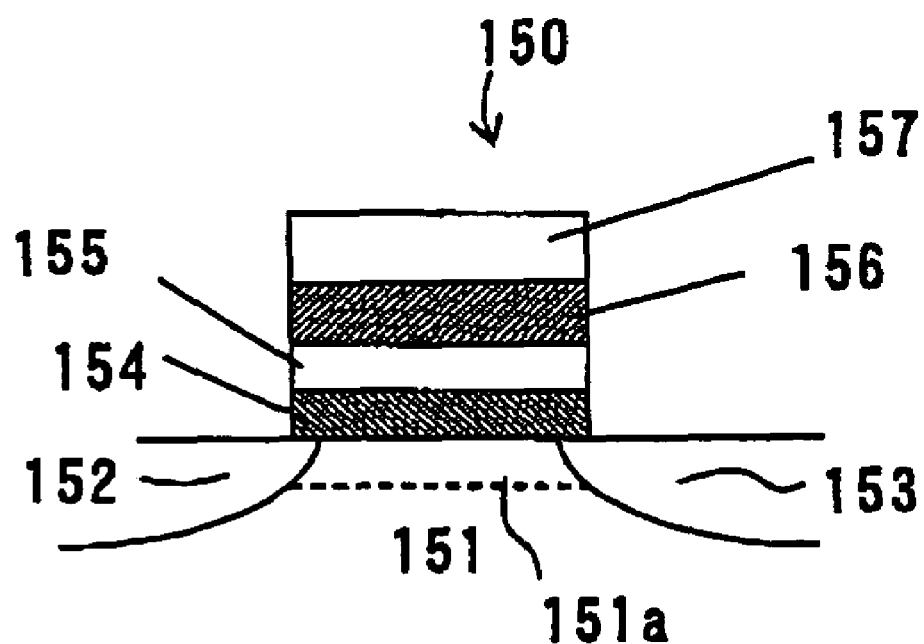
FIG. 16 is a schematic cross-sectional view of a conventional ETOX type flash memory.

The memory cell 50 has substantially the same layered structure as that of the memory cell 150 shown in FIG. 16.

In more detail, the memory cell 50 includes a source region 52 acting as one of two driving terminals and a drain region 53 acting as the other driving terminal provided in a surface area of a semiconductor substrate 51. The source region 52 and the drain region 53 are provided with a prescribed interval therebetween. The memory cell 50 further includes a channel region 51a provided between the source region 52 and the drain region 53 in the semiconductor substrate 51, a tunnel oxide layer 54 provided on the channel region 51a so as to cover edges of the source region 52 and the drain region 53, a floating gate 55, an interlayer insulating layer 56 and a control gate 57 acting as a control terminal. The tunnel oxide layer 54, the floating gate 55, the interlayer insulating layer 56, and the control gate 57 are formed sequentially in this order from the surface of the semiconductor substrate 51.

The memory cell 50 is formed of a floating gate field effect transistor.

Figure 2:
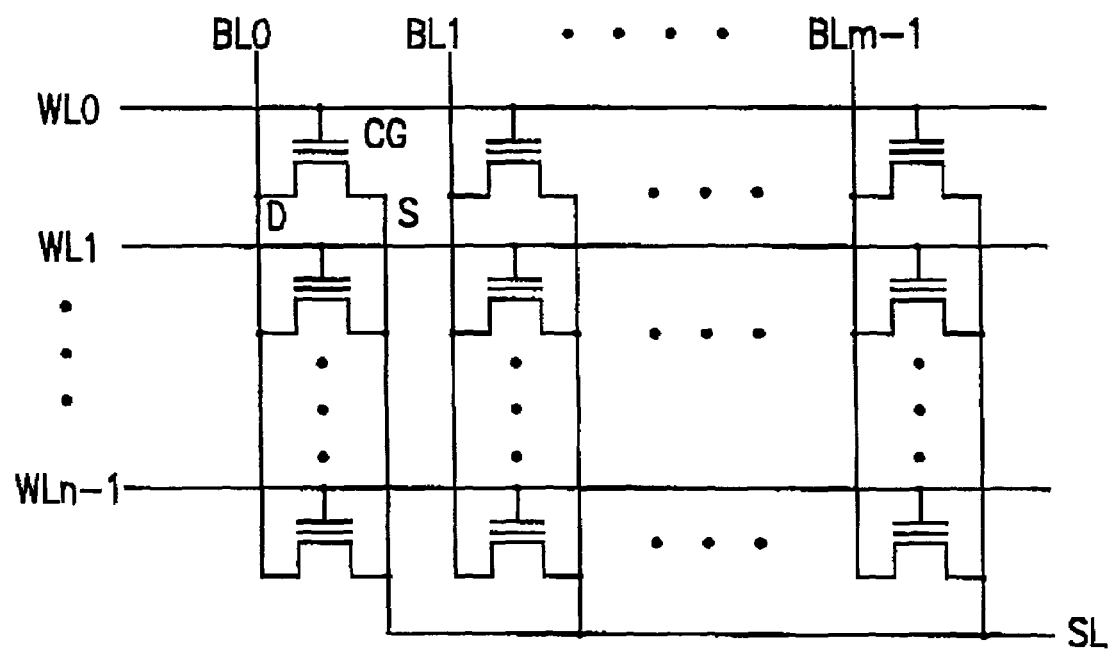
FIG. 2 is a circuit diagram illustrating one memory block included in a main cell array in the flash memory shown in FIG. 1B.

FIG. 2 is a circuit diagram illustrating a structure of one block of the main cell array 11a acting as a data region of the memory cell array 11 shown in FIG. 1A.

As shown in FIG. 2, each main memory cell 50 includes a drain terminal D, a control gate terminal CG, and a source terminal S. In the main memory cell 50, the control gate terminal CG is a control terminal, and the drain terminal D and the source terminal S are driving terminals.

The plurality of main memory cells 50 are arranged in a matrix, i.e., in rows and columns. "m" number of main memory cells 50 are arranged in each row, and "n" number of main memory cells 50 are arranged in each column. The word lines WL0 through WLn-1 extended in a row direction are each connected to m number of control gate terminals CG, each acting as a control terminal of the corresponding main memory cell 50.

The bit lines BL0 through BLm-1 extended in a column direction are each connected to n number of drain terminals D, each acting as one of two driving terminals of the corresponding main memory cell 50. The source terminals S, each acting as the other driving terminal of the corresponding main memory cell 50, in one memory block are connected to a common source line SL.

Figure 18:
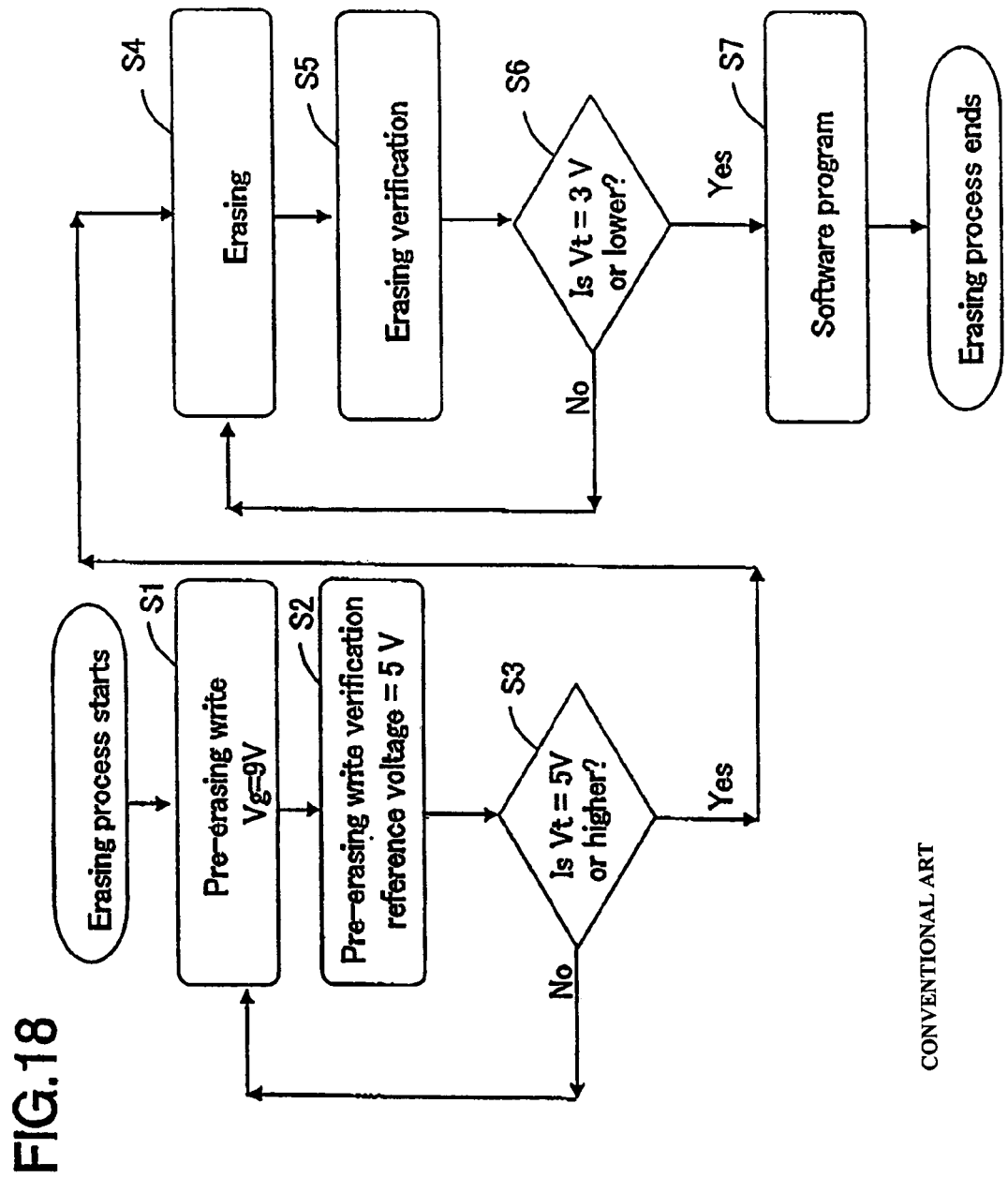
FIG. 18 is a flowchart illustrating an algorithm of a sequence of an erasing process of a conventional binary flash memory.

As shown in FIG. 18, the memory cell array 11 is connected to the word line voltage supply circuit 12 for supplying a voltage to each of the word lines WL0 through WLn-1, the common source line voltage supply circuit 13 for supplying a voltage to each of the common source lines SL, and the bit line voltage supply circuit 14 for supplying a voltage to each of the bit lines BL0 through BLm-1. The word line voltage supply circuit 12, the common source line voltage supply circuit 13, and the bit line voltage supply circuit 14 are controlled by the control circuit 15.

With reference to FIG. 1B, the word line voltage supply circuit 12 selects each of the word lines WL0 through WLn-1 sequentially based on a control signal and an address signal from the control circuit 15. The word line voltage supply circuit 12 also controls a data program write control signal for writing data to each main memory cell 50 of the main cell array 11a to be a data program write voltage, and thus applies the data program write control signal to each of the word lines WL0 through WLn-1 sequentially in a prescribed order. Thus, each of the word lines WL0 through WLn-1 is driven. The word line voltage supply circuit 12 acts as data program write means. The word line voltage supply circuit 12 includes a word line voltage control circuit 12a for controlling the voltage of each word line and a word line driver circuit 12b for selecting one of the word lines WL0 through WLn-1.

The common source line voltage supply circuit 13 selects the common source line SL commonly connected to the source terminals S of the main memory cells 50 in a memory block of interest in the memory cell array 11 based on a control signal and an address signal from the control circuit 15. The common source line voltage supply circuit 13 also controls, for example, the voltage of a data erasing control signal to be a data erasing voltage, and thus applies the data erasing control signal to the common source line SL. Thus, the common source line SL is driven. The common source line voltage supply circuit 13 includes a common source line voltage control circuit 13a for controlling the voltage of the common source line SL and a common source line driver circuit 13b for selecting the common source line SL.

The bit line voltage supply circuit 14 selects each of the bit lines BL0 through BLm-1 sequentially in a prescribed order based on a control signal and an address signal from the control circuit 15. The bit line voltage supply circuit 14 also controls a data program write/data read control signal to be applied to the bit lines BL0 through BLm-1. Thus, the bit lines BL0 through BLm-1 are driven.

In the flash memory 10, a verification procedure is performed on the following stages (1) after the program write procedure is performed; (2) after the pre-erasing write procedure is performed in order to prevent excessive erasing, the pre-erasing write procedure being performed before applying an erasing pulse as a signal pulse to each memory cell for the data erasing operation; and (3) after an erasing pulse is applied for the erasing procedure. The verification procedure is performed in order to check whether the procedure performed therebefore has been accurately performed.

In each verification procedure, a reference cell in the reference cell array 11b is compared with the corresponding main memory cell 50, and thus it is checked whether the threshold voltage of the main memory cell 50 has reached a prescribed threshold voltage.

In the bit line voltage supply circuit 14, the sense amplifier 34 senses the potential corresponding to the magnitude of the current flowing in a corresponding main memory cell 50 and the potential corresponding to the magnitude of the current flowing in the corresponding reference cell. Thus, the threshold voltage of the main memory cell 50 is compared with a prescribed threshold voltage of the reference cell.

Based on the result of the sensing of the sense amplifier 34, the comparison circuit 36 examines the threshold voltage of the main memory cell 50 in the verification procedure, and transfers a signal, to the control circuit 15, which indicates whether to continue or stop the application of a data program write pulse and a data read pulse to each main memory cell 50.

The reference word line voltage generation circuit 20 is provided in the vicinity of the memory cell array 11, and is controlled by the control circuit 15. In each verification procedure, the reference word line voltage generation circuit 20 increases or decreases the supply voltage based on a control signal to generate a reference word line voltage, and applies the generated reference word line voltage to a word line connected to a reference cell (hereinafter, referred to also as the "reference word line"). Thus, the reference word line is driven. As described above, the verification procedure is performed (1) after the program write procedure, (2) after the pro-erasing write procedure, and (3) after the erasing procedure.

In the first example, the write and erasing section 40 (FIG. 1A) performs the pre-erasing write operation to a plurality of memory cells with different voltages from the prescribed voltages for the program write operation, in order to reduce the electric field stress applied on the main memory cell during the erasing procedure.

In more detail, the word line voltage supply circuit 12 is controlled such that the gate voltage (control voltage) applied to a word line in the pre-erasing write procedure is lower than the gate voltage (control voltage) used in the program write procedure. The word line voltage supply circuit 12 is controlled such that the reference voltage used in the pre-erasing write verification procedure is lower than the reference voltage used in the program write verification procedure.

Hereinafter, the reference word line voltage generation circuit 20 included in the word line voltage supply circuit 12 and the reference circuit 30 included in the bit line voltage supply circuit 14 will be described in more detail.

As described above, the word line voltage supply circuit 12 includes the word line voltage control circuit 12a and the word line driver circuit 12b.

The word line voltage control circuit 12a is a voltage control section formed of a voltage control circuit for controlling a voltage which is to be applied to each of the word lines WL0 through WLn-1 in the program write procedure, the erasing procedure, the pre-erasing write procedure, and the read procedure.

The word line driver circuit 12b selects a program write pulse voltage for the program write procedure, selects an erasing pulse voltage for the erasing procedure, selects a pre-erasing write pulse voltage for the pre-erasing write procedure, and selects a read pulse voltage for the read procedure. The word line driver circuit 12b then selectively outputs the voltages to each of the word lines WL0 through WLn-1 in a prescribed order. The word line driver circuit 12b is formed of a conventional switching circuit.

Figure 3:
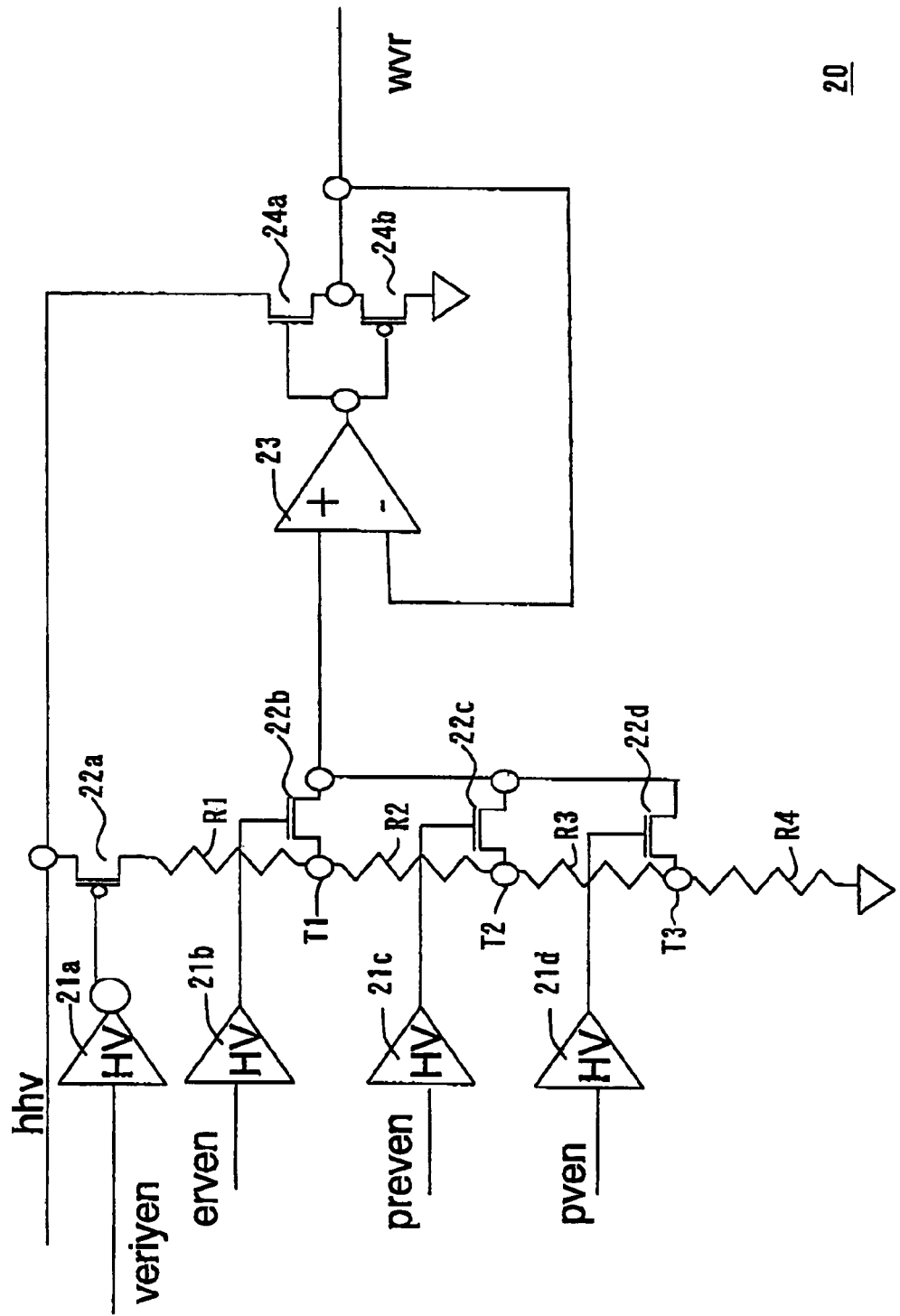
FIG. 3 is a circuit diagram illustrating an example of a reference word line voltage generation circuit used for a verification procedure in the flash memory shown in FIG. 1B.

FIG. 3 is a circuit diagram illustrating an example of the reference word line voltage generation circuit 20 shown in FIG. 1B.

The reference word line voltage generation circuit 20 includes inverter-type level shifter circuits 21a through 21d, resistors R1 through R4, a PMOS transistor 22a, NMOS transistors 22b through 22d, an amplifier 23, an NMOS transistor 24a, and a PMOS transistor 24b.

An input of the level shifter circuit 21a receives a verification control signal veriyen, and an output of the level shifter circuit 21a is connected to a gate of the PMOS transistor 22a. A source of the PMOS transistor 22a is connected to a supply voltage hhv, and a drain of the PMOS transistor 22a is connected to a terminal T1 via the resistor R1.

The terminal T1 is connected to three resistors R2 through R4 in series, and the resistors R2 through R4 are connected to each other via a terminal T2 and a terminal T3. The terminal T3 is connected to the ground (GND) via the resistor R4. The resistors R1 through R4 are included in a voltage division output line for dividing the supply voltage hhv.

The terminals T1, T2 and T3 are respectively connected to drains of the NMOS transistors 22b, 22c and 22d.

A gate of the NMOS transistor 22b is connected to an output of the level shifter circuit 21b, a gate of the NMOS transistor 22c is connected to an output of the level shifter circuit 21c, and a gate of the NMOS transistor 22d is connected to an output of the level shifter circuit 21d.

Sources of the NMOS transistors 22b through 22d are commonly connected to a positive input of the amplifier 23. An output of the amplifier 23 is connected to a gate of the NMOS transistor 24a and a gate the PMOS transistor 24b, the gates being connected to each other.

A drain of the NMOS transistor 24a is connected to the supply voltage hhv, and a drain of the PMOS transistor 24b is connected to the ground. A source of the NMOS transistor 24a and a source of the PMOS transistor 24b are connected to each other, so that a reference word line signal wvr is output from the output of the reference word line voltage generation circuit 20. The source of the NMOS transistor 24a and the source of the PMOS transistor 24b are also connected to a negative input of the amplifier 23, so as to form a voltage follower circuit.

The erasing control signal erven is input to the level shifter circuit 21b, and the output of the level shifter circuit 21b is connected to the gate of the NMOS transistor 22b as described above. When the verification control signal veriyen becomes "high" and the erasing control signal erven becomes "high", a signal corresponding to the potential of the terminal T1 is output to the positive input of the amplifier 23 via the NMOS transistor 22b as a reference signal.

The pre-erasing write control signal preven is input to the level shifter circuit 21c, and the output of the level shifter circuit 21c in connected to the gate of the NMOS transistor 220 as described above. When the verification control signal veriyen becomes "high" and the pre-erasing write control signal preven becomes "high", a signal corresponding to the potential of the terminal T2 is output to the positive input of the amplifier 23 via the NMOS transistor 22c as a reference signal.

The program write control signal pven is input to the level shifter circuit 21d, and the output of the level shifter circuit 21d is connected to the gate of the NMOS transistor 22d as described above. When the verification control signal veriyen becomes "high" and the program write control signal pven becomes "high", a signal corresponding to the potential of the terminal T3 is output to the positive input of the amplifier 23 via the NMOS transistor 22d as a reference signal.

Thus, the reference signal is output via one of the NMOS transistors 22b through 22d.

The verification control signal veriyen is a pulse control signal. When the verification control signal veriyen becomes "high" in a verification procedure, the signal output from the level shifter circuit 21a is inverted to the "low" level. When a "low" signal is input to the gate of the PMOS transistor 22a via the level shifter circuit 21a, the PMOS transistor 22a is turned ON. When a "high" signal is input to the gate of the PMOS transistor 22a via the level shifter circuit 21a, the PMOS transistor 22a is turned OFF.

The erasing control signal erven, the pre-erasing write control signal proven, and the program write control signal pven are each a pulse control signal. The control circuit 15 places the erasing control signal erven into a "high" level state in the erasing operation, places the pre-erasing write control signal preven into a "high" level state in the pre-erasing write operation, and places the program write control signal pven into a "high" level state in the program write operation.

When the erasing control signal erven is placed into the "high" level state, the voltage of the erasing control signal erven becomes an erasing pulse voltage. When the pre-erasing write control signal preven is placed into the "high" level state, the voltage of the pre-erasing write control signal preven becomes a pre-erasing write pulse voltage. When the program write control signal pven is placed into the "high" level state, the voltage of the program write control signal pven becomes a program write pulse voltage.

Accordingly, when the erasing control signal erven, the pre-erasing write control signal preven, or the program write control signal pven become "high", the corresponding NMOS transistor, among the NMOS transistors 22b through 22d, is turned ON. When the erasing control signal erven, the pre-erasing write control signal preven, or the program write control signal pven become "low", the corresponding NMOS transistor, among the NMOS transistors 22b through 22d, is turned OFF.

When one of the erasing control signal erven, the pre-erasing write control signal preven, and the program write control signal pven becomes "high" while the verification control signal veriyen is "high", the NMOS transistor, among the NMOS transistors 22b through 22d, is turned ON. In this case, a reference signal of a different voltage is output from the source of the corresponding NMOS transistor 22b, 22c or 22d based on the "high" control signal among the erasing control signal erven, the pre-erasing write control signal preven, and the program write control signal pven.

The reference signal is input to the positive input of the amplifier 23 included in the voltage follower circuit and is lowered in impedance, and then is output from the output of the amplifier 23. The reference signal is then input to the gates of the NMOS transistor 24a and the PMOS transistor 24b. Based on the reference signal, a reference word line signal wvr is output from the reference circuit 30 from the sources of the NMOS transistor 24a and the PMOS transistor 24b. The voltage of the reference word line signal wvr can be set to a desired value by the resistors R1 through R4.

In the reference word line voltage generation circuit 20, the NMOS transistors 22b through 22d, for respectively supplying the erasing control signal erven, the pre-erasing write control signal proven, and the program write control signal pven, are connected to the voltage division output line. Therefore, the reference signals for the erasing operation, the pre-erasing write operation, and the program write operation are supplied to the amplifier 23. Since the NMOS transistors 22b through 22d are connected in this order from the power supply hhv, the voltage of the reference signal is highest in the erasing operation, second highest in the pre-erasing write operation, and lowest in the program write operation.

Accordingly, the potential of the reference word line signal wvr is highest in the erasing operation, second highest in the pre-erasing write operation, and lowest in the program write operation. For example, the voltage of the reference word line signal wvr in the program write operation is lower than the voltage of the reference word line signal wvr in the pre-erasing write operation.

Figure 4:
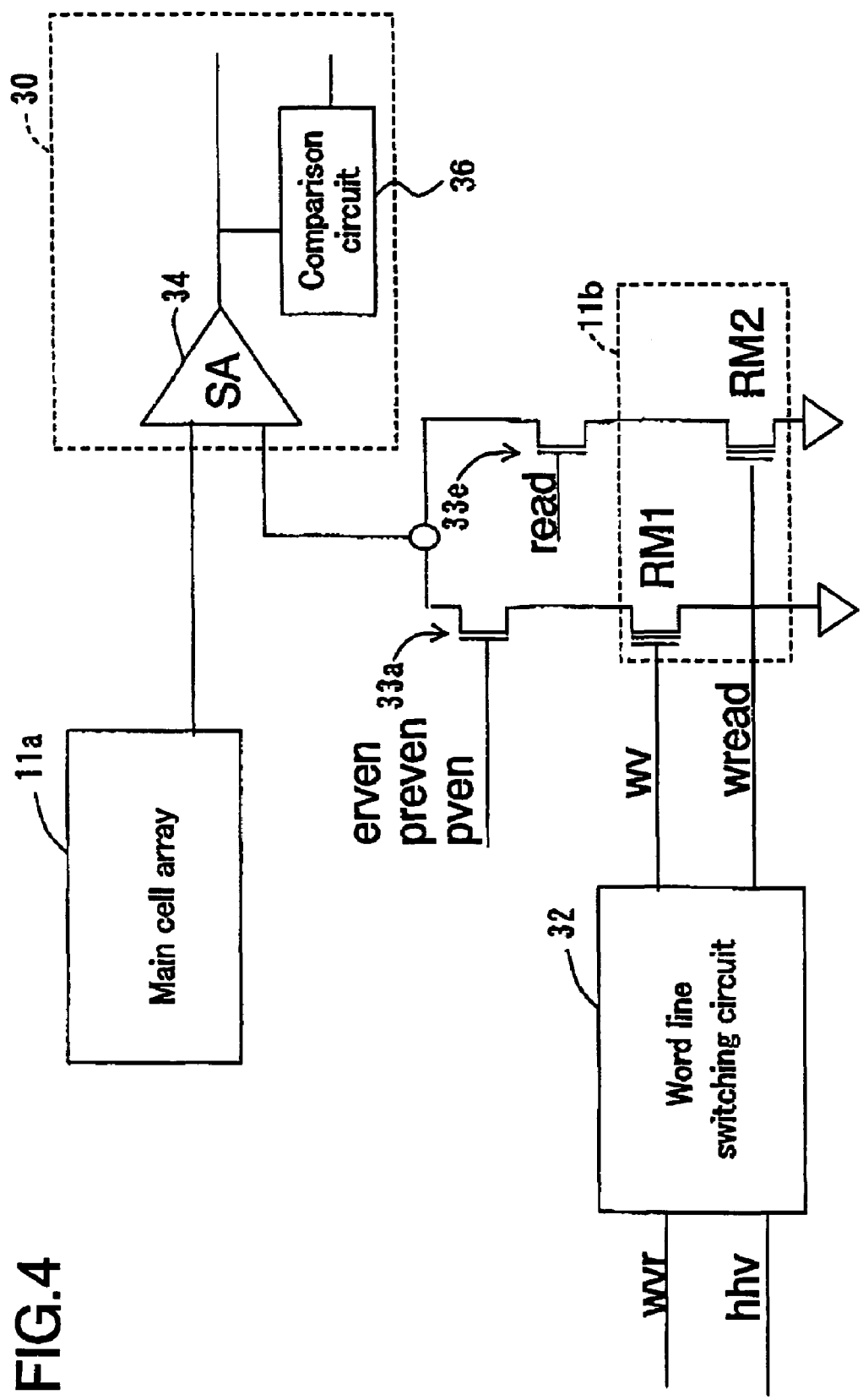
FIG. 4 is a circuit diagram illustrating an example of a reference circuit and the vicinity thereof used for the verification procedure in the flash memory shown in FIG. 1B.

FIG. 4 is a circuit diagram illustrating an example of the reference circuit 30 and the vicinity thereof shown in FIG. 1B.

FIG. 4 shows the main cell array 11a and the reference cell array 11b separately for easier understanding of the functions of the reference circuit 30.

The reference circuit 30 includes NMOS transistors 33a and 33e and the sense amplifier 34.

The reference cell array 11b includes reference cells RM1 and RM2. The reference cells RM1 and RM2 each have its own threshold voltage.

The reference cell RM1 has a threshold voltage of 3 V, and is used in the verification procedure after each of the program write procedure, the erasing procedure, and the pre-erasing write procedure.

The reference cell RM2 has a threshold voltage of 4 V, and is used in the read procedure.

The reference cells RM1 and RM2 are provided in the reference cell array 11b, which is located in a different area from that of the main cell array 11a. The word line corresponding to each of the reference cells RM1 and RM2 is selected and driven by the word line switching circuit 32.

The word line switching circuit 32 receives the supply voltage hhv and the reference word line signal wvr which is output from the reference word line voltage generation circuit 20. In the verification procedure after each of the program write procedure, the erasing procedure, and the pre-erasing write procedure, a reference word line signal wv is supplied from the word line switching circuit 32 to a gate of the selected reference cell RM1 via the word line.

As described above, the voltage of the reference word line signal wvr which is output from the reference word line voltage generation circuit 20 is highest in the erasing operation, second highest in the pre-erasing write operation, and lowest in the program write operation. Accordingly, the voltage of a reference word line signal wv which is output from the word line switching circuit 32 is also highest in the erasing operation, second highest in the pre-erasing write operation, and lowest in the program write operation.

In the read procedure, a reference word line signal wread is supplied from the word line switching circuit 32 to a gate of the selected reference cell RM2 via the word line.

A source of each of the reference cells RM1 and RM2 is connected to the ground, a drain of the reference cell RM1 is connected to the NMOS transistor 33a, and a drain of the reference cell RM2 is connected to the NMOS transistor 33e.

A gate of the NMOS transistor 33a is supplied with the program write control signal pven, the erasing control signal erven, and the pre-erasing write control signal preven. A gate of the NMOS transistor 33e is supplied with the read control signal read.

A source of the NMOS transistor 33a and a source of the NMOS transistor 33e are commonly connected to one of the two inputs of the sense amplifier 34. The other input of the sense amplifier 34 is connected to the main cell array 11a.

In the verification procedure after each of the program write procedure, the erasing procedure, and the pre-erasing write procedure, the NMOS transistor 33a is turned ON by a corresponding control signal among the program write control signal pven, the erasing control signal erven, and the pre-erasing write control signal preven. Thus, one of the inputs of the sense amplifier 34 and the reference cell RM1 are electrically connected to each other via the NMOS transistor 33a. By this connection, a potential corresponding to the magnitude of the current flowing in a main memory cell 50 in the main cell array 11a and a potential corresponding to the magnitude of the current flowing in the reference cell RM1 are sensed by the sense amplifier 34. Thus, it is determined whether or not the threshold voltage of the main memory cell 50 has reached a prescribed threshold voltage after the program write procedure, after the erasing procedure, and after the pre-erasing write procedure.

In the read procedure, the NMOS transistor 33e is turned ON by the read control signal read. Thus, one of the inputs of the sense amplifier 34 and the reference cell RM2 are electrically connected to each other via the NMOS transistor 33e. By this connection, a potential corresponding to the magnitude of the current flowing in a main memory cell 50 in the main cell array 11a and a potential corresponding to the magnitude of the current flowing in the reference cell RM2 are sensed by the sense amplifier 34. Thus, it is determined whether data of the main memory cell 50 is "0" or "1".

When the reference word line signal wv is supplied to a control gate terminal of the reference cell RM1, the magnitude of the current flowing in the reference cell RM1 is highest in the erasing procedure, second highest in the pre-erasing write procedure, and lowest in the program write procedure. The reason for this is that the potential of the reference word line signal wv is highest in the erasing operation, second highest in the pre-erasing write operation, and lowest in the program write operation.

Accordingly, for example, the reference voltage in the verification procedure after the pre-erasing write procedure is lower than the reference voltage in the verification procedure after the program write procedure. The reason for this is that the voltage of the reference word line signal wv in the verification procedure after the pre-erasing write procedure is higher than the voltage of the reference word line signal wv in the verification procedure after the program write procedure.

In a main memory cell 50 in the main cell array 11a, the sense amplifier 34 senses that the threshold voltage is lowest in the erasing operation, second lowest in the pre-erasing write operation, and highest in the program write operation. Namely, the magnitude of the current flowing in the main memory cell 50 is highest in the erasing operation, second highest in the pre-erasing write operation, and lowest in the program write operation. For example, the sense amplifier 34 senses that the threshold voltage of the main memory cell 50 after the pre-erasing write operation is higher than that after the erasing operation, and is lower than that after the program write operation.

Next, an erasing algorithm of a sequence of an erasing process of the flash memory 10 will be described in detail.

Figure 5:
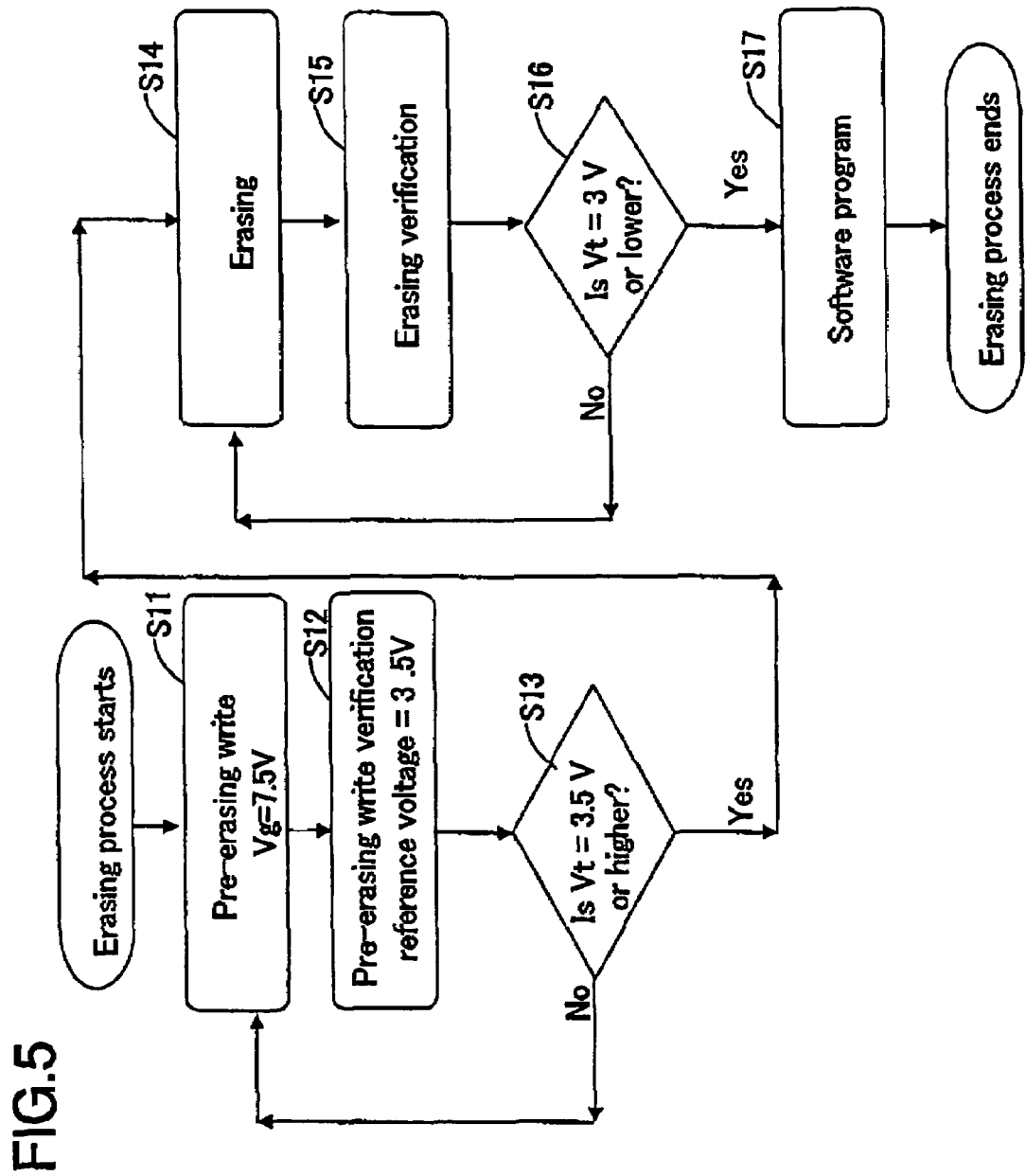
FIG. 5 is a flowchart illustrating an algorithm of a sequence of an erasing process of the flash memory shown in FIG. 1B.

FIG. 5 is a flowchart illustrating the erasing algorithm of the sequence of the erasing process of the flash memory 10.

Figure 17:
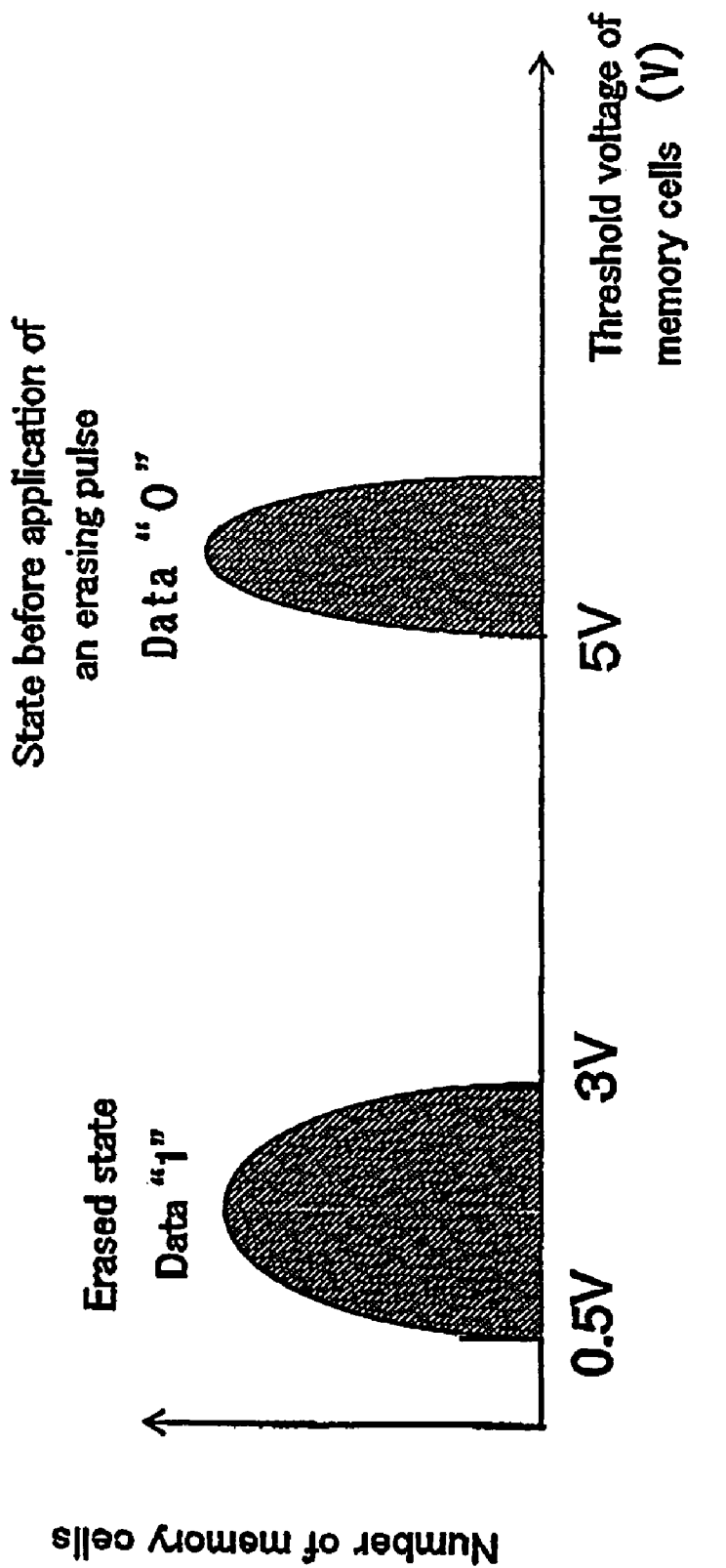
FIG. 17 is a graph a distribution of the threshold voltages of memory cells in a conventional binary flash memory.

As shown in FIG. 17, the threshold voltages of the memory cells in a memory block before the erasing process are one of the two states mentioned above, i.e., the state of being 0.5 V to 3 V and the state of 5 V or higher.

As shown in FIG. 5, the erasing process starts with the pre-erasing write procedure in step S11, which is performed on all the memory cells in a memory block which is designated for erasing. The pre-erasing write procedure is performed in order to prevent excessive erasing. For the pre-erasing write procedure, the voltages (or a voltage condition) shown in Table 5 below ("pre-erasing write") are used. The gate voltage Vg at this point is set to be lower than a voltage for program write operation, i.e., the program write procedure (9 V in this example); for example, 7.5 V. The gate voltage Vg is controlled by the word line voltage supply circuit 12. Table 5 shows the voltages applied in a program write procedure, an erasing procedure, and a read procedure. Table 5 shows the voltages when the channel erasing method is used.

TABLE 5

|  | Control gate | Drain | Source | Substrate |
| --- | --- | --- | --- | --- |
| Program write | 9 V | 5 V/0 V or Open | 0 V | 0 V |

TABLE 5-continued

| | Control gate | Drain | Source | Substrate |
|---|---|---|---|---|
| Erasing | −9 V | Open | Open | 6 V |
| Read | 5 V | 1 V | 0 V | 0 V |
| Pre-erasing write | 7.5 V | 5 V/0 V or Open | 0 V | 0 V |

The drain voltage is 5 V in a memory cell to which writing is to be performed, and is 0 V or in an open state in a memory cell to which no writing is to be written. The pre-erasing write procedure increases the threshold voltage of the memory cell. In Table 5, the voltages for the procedures other than the pre-erasing write procedure, i.e., the voltages for the program write procedure, the erasing procedure, and the read procedure are the same as those shown in Table 2 (the channel erasing method).

Next, in step S12, the verification procedure is performed for verifying the pre-erasing write. For the verification procedure, the reference word line voltage generation circuit 20 (FIG. 3) and the reference circuit 30 (FIG. 4) are used.

In the reference word line voltage generation circuit 20, the pre-erasing write control signal preven becomes high, and a reference word line signal wvr having a voltage lower than the voltage for the program write procedure, for example, 3.5 V is output.

In FIG. 4, the threshold voltage of the reference cell RM1 is 3 V, and a word line voltage of 5 V is applied to the word line connected to the main memory cell 50 in the main cell array 11a. Therefore, in step S13, it is checked whether or not the threshold voltages of the main memory cells 50 in the main cell array 11a are 3.5 V or higher. When it is determined in step S13 that there is a main memory cell 50 having a threshold voltage of less than 3.5 V in the main cell array 11a, the pre-erasing write operation is performed again on that main memory cell 50. The above-described pre-erasing write procedure and the pre-erasing write verification procedure are repeated until all the main memory cells 50 in the memory block obtain a threshold voltage of 3.5 V or higher.

Figure 6:
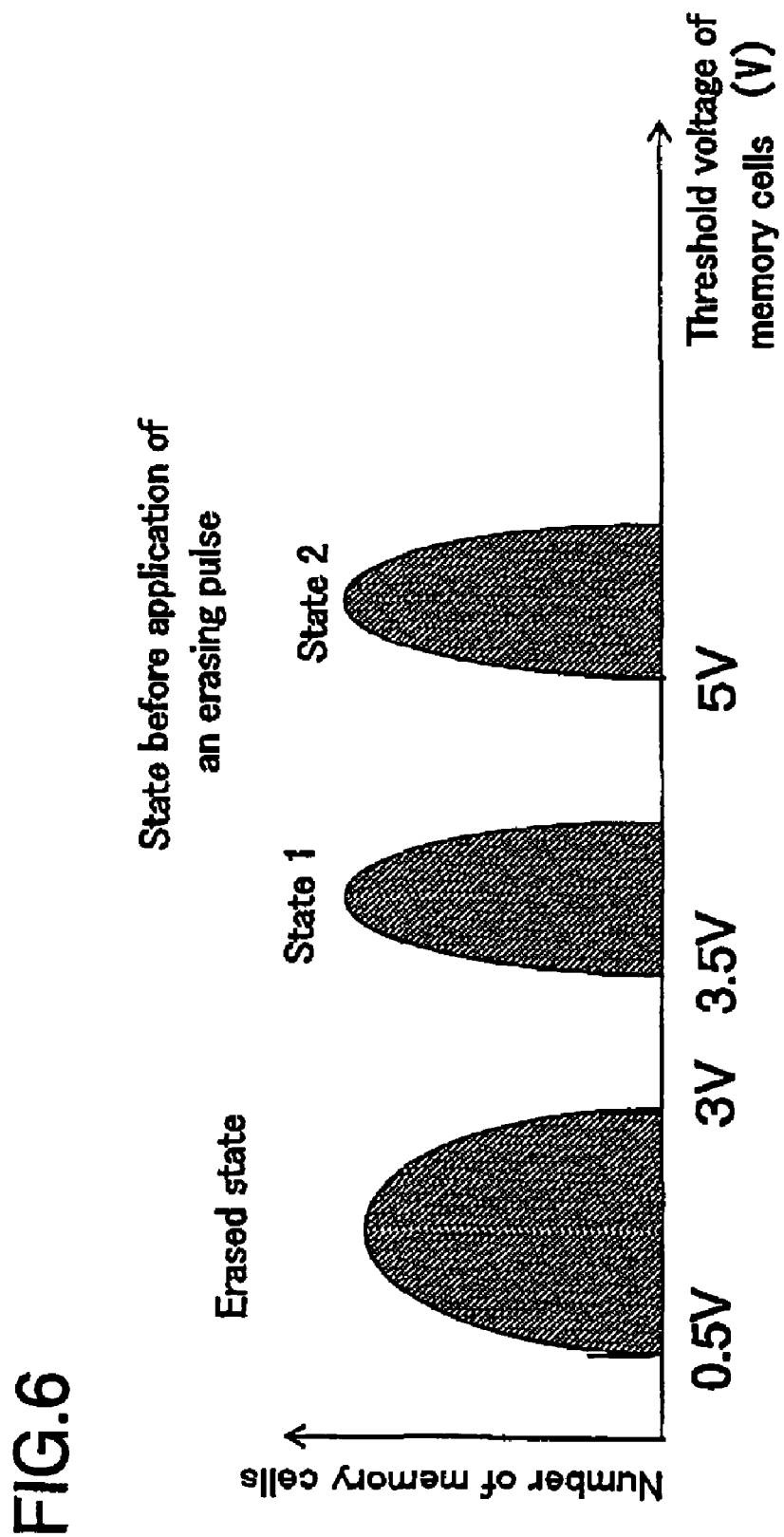
FIG. 6 is a graph illustrating a distribution of the threshold voltages of memory cells after the pre-erasing write operation and before an erasing pulse is applied in the flash memory shown in FIG. 1B.

After the pre-erasing write operation including the pre-erasing write procedure and the pre-erasing write verification procedure, the threshold voltages of the main memory cells in the memory block are distributed in one of the two states, i.e., the state of 3.5 V or higher (state 1 in FIG. 6) and the state of 5 V or higher (state 2 in FIG. 6). The main memory cells 50 which were in an erased state before the pre-erasing write operation was started are distributed in state 1 (3.5 V or higher). The main memory cells 50 which were already in a program written state before the pre-erasing write operation was started are distributed in state 2 (5 V or higher).

When it is determined in step S13 that all the main memory cells 50 in the memory block have a threshold voltage of 3.5 V or higher, the pre-erasing write procedure and the pre-erasing write verification procedure are terminated. Then, the erasing procedure is performed by applying an erasing pulse in step S14.

In step S14, an erasing pulse is applied to all the main memory cells 50 in the memory block with the voltages shown in Table 5.

At this point, a similar stress to that of the conventional art is applied to the memory cells distributed in state 2 (FIG. 6). According to the conventional art, as shown in Table 2, the pre-erasing write procedure is performed with the same voltages as those for the program write procedure. The gate voltage Vg is 9 V, and the reference voltage for the pre-erasing write verification procedure and the program write verification procedure is 5 V.

By contrast, according to the first example, the pre-erasing write operation is performed on the main memory cells 50 distributed in state 2 (FIG. 6) with a gate voltage Vg of 7.5 V and a reference voltage of 3.5 V for the pre-erasing write verification procedure. Therefore, the threshold voltages of the main memory cells are slightly lower than those of the conventional art, and the electric field stress is alleviated as compared to the conventional art.

The main memory cells 50 which were in an erased state before the pre-erasing operation was started are distributed in state 1 (FIG. 6). When an erasing pulse is applied to these main memory cells 50, the charge amount of the floating gate is Qfg=−0.3 V. The voltage Vfg of the floating gate when the erasing pulse is applied is:

0.6×(−9 V)+0.2×(6 V)−0.3 V=−4.5 V.

The electric field Eox which is applied to the tunnel oxide layer 54 is:

(6V−(−4.5 V))/100 Å=10.5 MeV.

According to the conventional art of performing the pre-erasing write procedure with the voltages shown in Table 2, the memory cells, to which the pre-erasing write procedure was performed, each receive an electric field stress of 11.4 MeV. By contrast, according to the first example, the electric field applied to the tunnel oxide layer 54 of each memory cell 50 is reduced. Namely, application of the excessive electric field on the tunnel oxide layer 54 of each memory cell 50 is prevented.

As described above, for at least the memory cells 50 which were in the erased state before the pre-erasing write procedure was started, the number of holes and electrons trapped in the memory cells is reduced, and thus data retention is improved. As described above, the strength of data retention can be generally dealt using probability. Therefore, when the degree of stress received by the memory cell is lowered, the strength of data retention in a memory block or a chip is clearly improved.

Next, in step S15, the erasing verification procedure of verifying the erasing is performed as follows.

In the reference word line voltage generation circuit 20 in FIG. 3, the erasing control signal erven becomes "high", and a reference word line signal wvr having a voltage of 5 V is output.

In FIG. 4, the threshold voltage of the reference cell RM1 is 3 V. A word line voltage of 5 V is applied to the reference word line connected to the reference cell, and a word line voltage of 5 V is applied to the word line in the main cell array 11a. Therefore, in step S16, it is checked whether or not the threshold voltages of the main memory cells 50 in the main cell array 11a are 3 V or lower. When it is determined in step S16 that there is a main memory cell 50 having a threshold voltage of more than 3 V in the main cell array 11a, the erasing operation is performed again on that main memory cell 50 by applying an erasing pulse. The above-described erasing procedure and the erasing verification procedure are repeated until all the main memory cells 50 in the memory block obtain a threshold voltage of 3 V or lower.

An erased state obtained after the erasing operation is performed on memory cells having a threshold voltage of about 3.5 V will be described.

FIG. 7 is a graph illustrating the relationship between the erasing stress time and the threshold voltage of the memory cells. The vertical axis represents the threshold voltage of the memory cells, and the horizontal axis represents the erasing pulse application time (i.e., erasing stress time).

It is understood from FIG. 7 that the threshold voltage obtained by applying an erasing stress for 100 ms to a memory cell having a threshold voltage of 3.5 V or higher before the application of the erasing pulse, and the threshold obtained by applying the erasing stress for 100 ms to a memory cell having a threshold voltage of about 5.0 V before the application of the erasing pulse, are substantially the same as each other. Thus, the problem of excessive erasing does not occur.

When it is determined in step S16 that all the main memory cells in the memory block obtain a threshold voltage of 3 V or lower, the erasing procedure of applying an erasing pulse and the erasing verification procedure are terminated.

In step S17, it is checked by a sequence of software (software program) whether or not there is a main memory cell having a threshold voltage of 0.5 V or lower. When there is such a main memory cell, that main memory cell is adjusted to have a threshold voltage of 0.5 V or higher and 3 V or lower. When the number of the main memory cells having a threshold voltage of 0.5 V or lower becomes zero, this sequence is terminated, and the erasing process is terminated.

EXAMPLE 2

In a second example of the present invention, a plurality of reference cells having different threshold voltages are used, and the verification procedure in the pre-erasing write operation is performed with a reference voltage which is lower than that used in the program write operation.

FIG. 5A is a block diagram illustrating a schematic structure of a flash memory 10a as a non-volatile semiconductor memory device according the second example of the present invention. The flash memory 100a has substantially the same structure as that of the flash memory 10 in the first example except for a reference circuit 30a and the reference cell array 11b'. Identical elements previously discussed with respect to FIGS. 1B and 4 bear identical reference numerals therewith and the detailed descriptions thereof will be omitted.

Figure 8A:
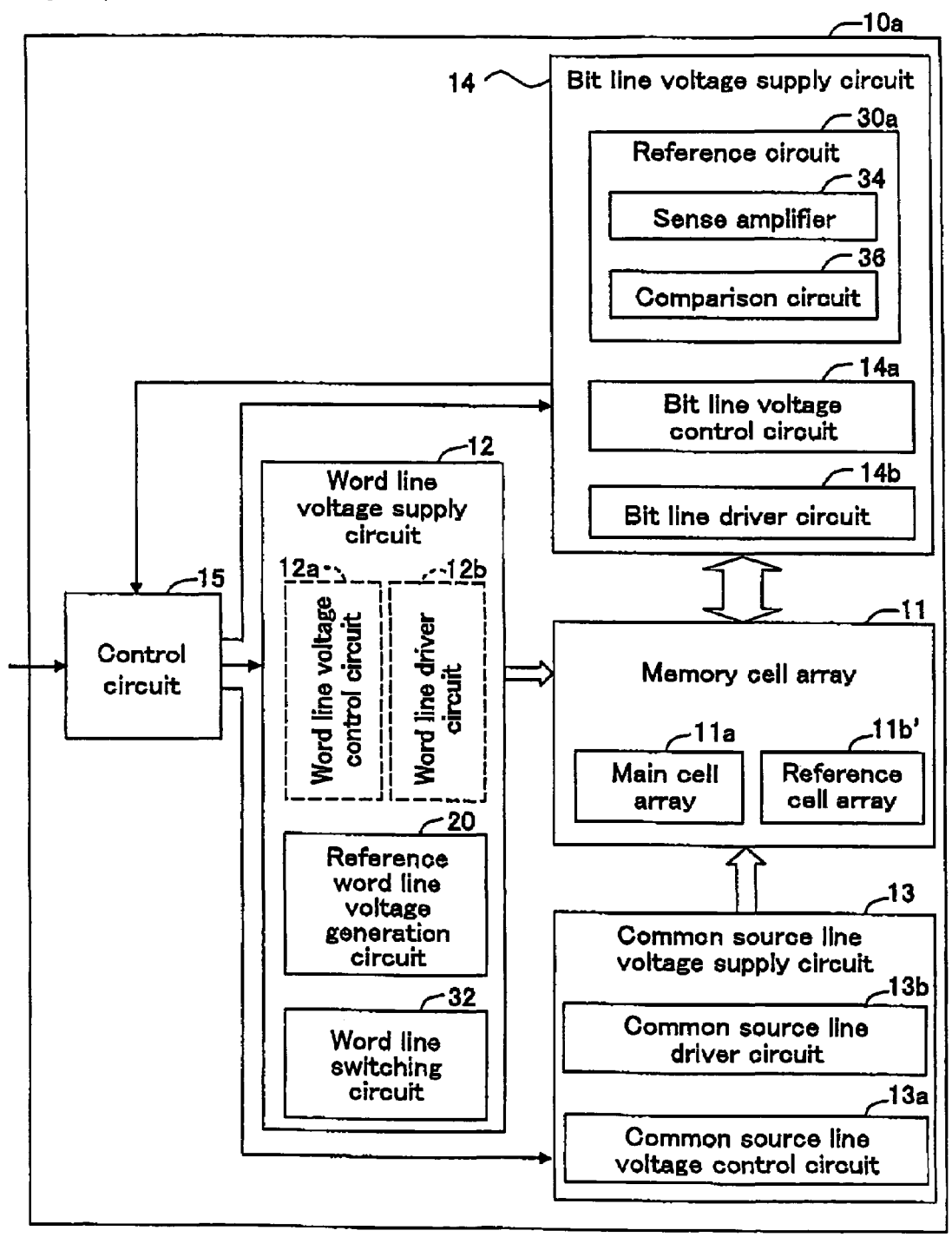
FIG 8A is a block diagram illustrating a schematic structure of a flash memory as an example of a non-volatile semiconductor memory device according to a second example of the present invention.
Figure 8B:
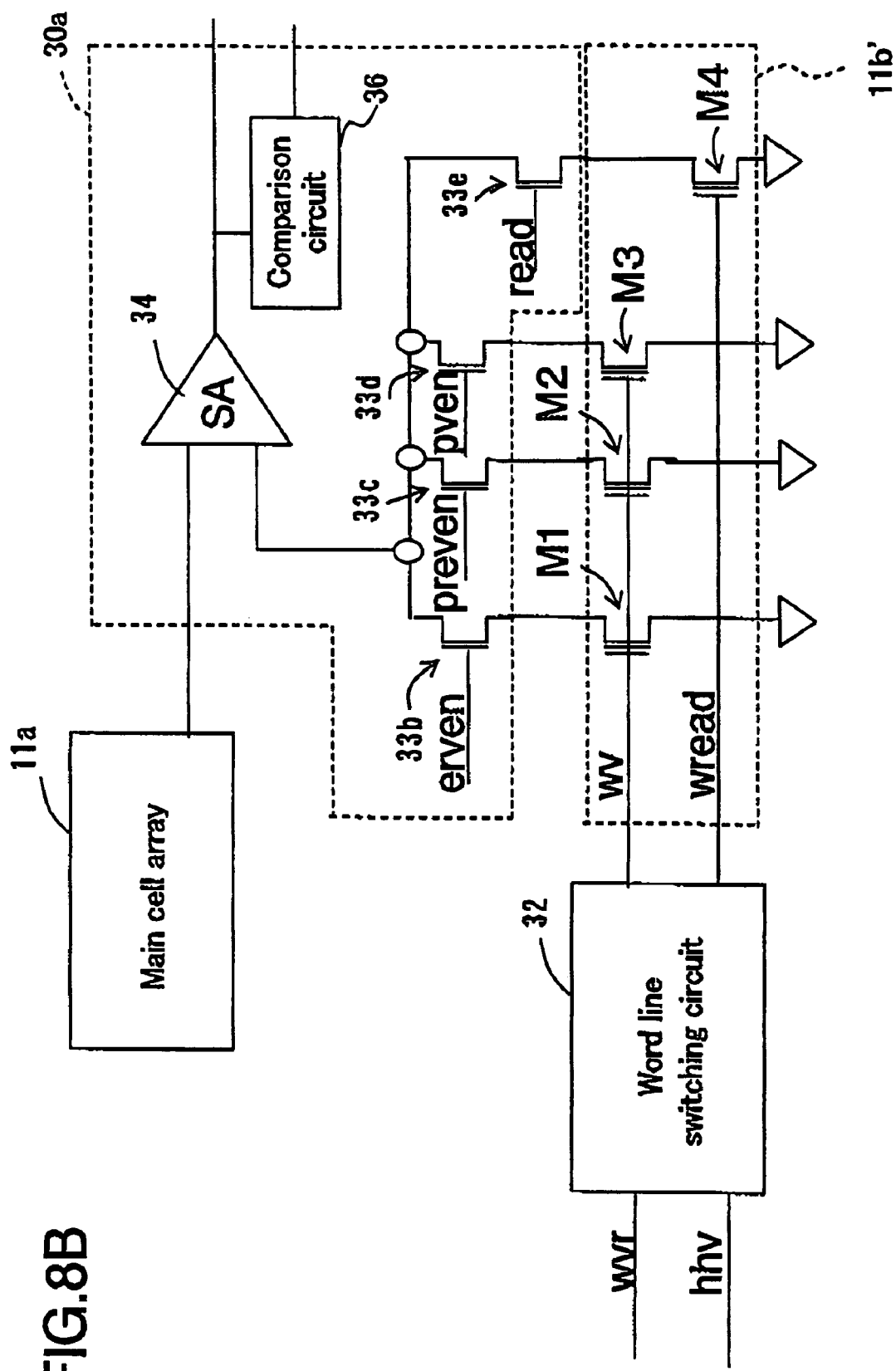
FIG. 8B is a circuit diagram illustrating an example of a reference circuit and the vicinity thereof used for a verification procedure in the flash memory according to the second example of the present invention.

FIG. 8B is a circuit diagram illustrating an example of a reference circuit 30a and the vicinity thereof shown in FIG. 8A. FIG. 8B shows the main cell array 11a and a reference cell array 11b' separately for easier understanding of the functions of the reference circuit 30a.

The reference circuit 30a includes a reference cell M1 having a threshold voltage of 3 V, a reference cell M2 having a threshold voltage of 3.5 V, a reference cell M3 having a threshold voltage of 5 V, and a reference cell M4 having a threshold voltage of 4 V.

The reference cell M1 is used for the verification procedure after the erasing procedure. The reference cell M2 is used for the verification procedure after the pre-erasing write procedure. The reference cell M3 is used for the verification procedure after the program write procedure. The reference cell M4 is used for the read procedure.

The reference cells M1 through M4 are provided in the reference cell array 11b', which is located in a different area from that of the main cell array 11a. The word line corresponding to each of the reference cells M1 through M4 is selected and driven by the word line switching circuit 32.

The word line switching circuit 32 receives the supply voltage hhv and the reference word line signal wvr which is output from the reference word line voltage generation circuit 20. The voltage of the reference word line signal wvr is different for the erasing operation, the pre-erasing write operation, and for the program write operation.

In the verification procedure after the erasing procedure, the reference word line signal wv for the erasing operation is supplied to a gate of the selected reference cell M1 via the reference word line.

In the verification procedure after the pre-erasing write procedure, the reference word line signal wv for the pre-erasing write operation is supplied to a gate of the selected reference cell M2 via the reference word line.

In the verification procedure after the program write procedure, the reference word line signal wv for the program write operation is supplied to a gate of the selected reference cell M3 via the reference word line.

In the read procedure, the reference word line voltage read for the read operation is supplied to a gate of the selected reference cell M4 via the reference word line.

Sources of the reference cells M1 through M4 are each connected to the ground, and drains of the reference cells M1 through M4 are connected to the drains of the NMOS transistors 33b through 33d and 33e, respectively. The gates of the NMOS transistors 33b through 33d are respectively supplied with the program write control signal pven, the erasing control signal erven, and the pre-erasing write control signal preven through the corresponding control lines. The gate of the NMOS transistor 33e is supplied with the read control signal read via the corresponding control line.

The sources of the NMOS transistors 33b through 33d and 33e are commonly connected to one of the two inputs of the sense amplifier 34, and the other input of the sense amplifier 34 is connected to the main cell array 11a.

In the verification procedure after each of the program write procedure, the erasing procedure, and the pre-erasing write procedure, one of the NMOS transistors 33b through 33d is turned ON by one corresponding control signal among the erasing control signal erven, the pre-erasing write control signal preven, and the program write control signal pven. Thus, one of the inputs of the sense amplifier 34 and one of the reference cells M1 through M3 are electrically connected to each other via one corresponding NMOS transistor among the NMOS transistors 33b through 33d.

By this connection, a potential corresponding to the magnitude of the current flowing in a main memory cell 50 in the main cell array 11a and a potential corresponding to the magnitude of the current flowing in one of the reference cells M1 through M3 are sensed by the sense amplifier 34. Thus, it is determined whether or not the threshold voltage of the main memory cell 50 has reached a prescribed threshold voltage after the program write procedure, after the erasing procedure, and after the pre-erasing write procedure.

In the read procedure, the NMOS transistor 33e is turned ON by the read control signal read. Thus, one of the inputs of the sense amplifier 34 and the reference cell M4 are electrically connected to each other via the NMOS translator 33e.

By this connection, a potential corresponding to the magnitude of the current flowing in a main memory cell 50 in the main cell array 11a and a potential corresponding to the magnitude of the current flowing in the reference cell M4 are sensed by the sense amplifier 34. Thus, it is determined whether data of the main memory cell 50 is "0" or "1".

In the reference circuit 30a, the reference cells M1 through M3 are respectively used for the data erasing verification procedure, the pre-erasing write verification procedure, and the program write verification procedure as described above. Control gates of the reference cells M1 through M3 are supplied with the reference word line signals wv. The voltages of the reference word line signals wv supplied to the reference cells M1 through M3 are different in accordance with whether the signal wv is for the erasing operation, the pre-erasing write operation, or the program write operation. The threshold voltages of the reference cells M1 through M3 are different. Therefore, the magnitude of the current flowing in each of the reference cells M1 through M3 is highest in the erasing procedure, second highest in the pre-erasing write procedure, and lowest in the program write procedure.

Accordingly, for example, the reference voltage in the verification procedure after the pre-erasing write procedure is lower than the reference voltage in the verification procedure after the program write procedure.

In a main memory cell 50 in the main cell array 11a, the sense amplifier 34 senses that the threshold voltage is lowest in the erasing operation, second lowest in the pre-erasing write operation, and highest in the program write operation. Namely, the magnitude of the current flowing in the main memory cell 50 is highest in the erasing operation, second highest in the pre-erasing write operation, and lowest in the program write operation. For example, the sense amplifier 34 senses that the threshold voltage of the main memory cell 50 after the pre-erasing write operation is higher than that after the erasing operation (after the erasing pulse is applied), and is lower than that after the program write operation.

Next, an erasing algorithm of a sequence of an erasing process of the flash memory 10a will be described in detail with reference to FIG. 5, which was used above for the flash memory 10.

As shown in FIG. 17 and also as in the first example, the threshold voltages of the memory cells in a memory block before the erasing process are one of the two states mentioned above, i.e., the state of being 0.5 V to 3 V and the state of 5 V or higher.

As shown in FIG. 5, the erasing process starts with the pre-erasing write procedure in step S11, which is performed on all the memory cells in a memory block which is designated for erasing, as in the first example. The pre-erasing write procedure is performed in order to prevent excessive erasing. For the pre-erasing write procedure, the voltages shown in Table 5 above ("pre-erasing write") are used. The gate voltage Vg at this point is set to be lower than a voltage for the program write procedure (9 V in this example); for example, 7.5 V. The gate voltage Vg is controlled by the word line voltage supply circuit 12. The drain voltage is 6 V (or 5 V) in a memory cell to which writing is performed, and is 0 V or in an open state in a memory cell to which no writing is performed. The pre-erasing write procedure increases the threshold voltage of the memory cell.

Next, in step S12, the verification procedure is performed for verifying the pre-erasing write. For the verification procedure, the reference circuit 30a (FIG. 8B) is used.

In the reference circuit 30a, the pre-erasing write control signal proven becomes "high", and the reference call M2 having a threshold voltage of 3.5 V is selected. A word line voltage of 5 V is applied to the word lines in the main cell array 11a and the reference cell array 11b'. Therefore, in step S13, it is checked whether or not the threshold voltages of the main memory cells 50 in the main cell array 118 are 3.5 V or higher. When it is determined in step S13 that there is a main memory cell 50 having a threshold voltage of less than 3.5 V in the main cell array 11a, the pre-erasing write operation is performed again on that main memory cell 50 as in the first example. The above-described pre-erasing write procedure and the pre-erasing write verification procedure are repeated until all the main memory cells 50 in the memory block obtain a threshold voltage of 3.5 V or higher.

After the pre-erasing write operation (before the erasing pulse is applied), the threshold voltages of the main memory cells in the memory block are distributed in one of the two states, i.e., the state of 3.5 V or higher (state 1 in FIG. 6) and the state of 5 V or higher (state 2 in FIG. 6). The main memory cells 50 which were in an erased state before the pre-erasing write operation was started are distributed in state 1 (3.5 V or higher). The main memory cells 50 which were already in a program written state before the pre-erasing write operation was started are distributed in state 2 (5 V or higher).

When it is determined in step S13 that all the main memory cells 50 in the memory block have a threshold voltage of 3.5 V or higher, the pre-erasing write procedure and the pre-erasing write verification procedure are terminated. Then, the erasing procedure is performed by applying an erasing pulse to all the main memory cells 50 in the memory block in step S14.

Steps S14 through S17 are performed in the same manner as those in the first example, and will not be described here. In the second example also, for at least the memory cells which were in an erased state before the erasing pulse was applied, the number of holes and electrons trapped in the memory cells is reduced, and thus data retention is improved.

The second example uses the reference word line voltage generation circuit 20 (FIG. 3) for generating different word line voltages for the program write operation, the pre-erasing write operation, and the erasing operation; and the reference circuit 30a (FIG. 8A and 8B) using a plurality of reference cells having different threshold voltages. The present invention is not limited to this. In the case where the reference word line voltage is the same for the program write operation, the pre-erasing write operation, and the erasing operation, and the threshold voltages of the reference cells (FIG. 8B) are different, the same effect as above are provided.

EXAMPLE 3

In the first example, the reference circuit 30 (FIG. 4) and the reference word line voltage generation circuit 20 (FIG. 3) are used. In the second example, the reference circuit 30a (FIGS. 8A and 8B) and the reference word line voltage generation circuit 20 (FIG. 3) are used. In a third example of the present invention, a general reference circuit and a general reference word line voltage generation circuit are used for reducing the electric field stress on the memory cell when an erasing pulse is applied.

For the pre-erasing write verification procedure, the reference voltage is set to be the same level as that for the program write verification procedure. Thus, the pre-erasing write verification procedure is performed with a reference voltage which is lower than that for the program write procedure.

Figure 9A:
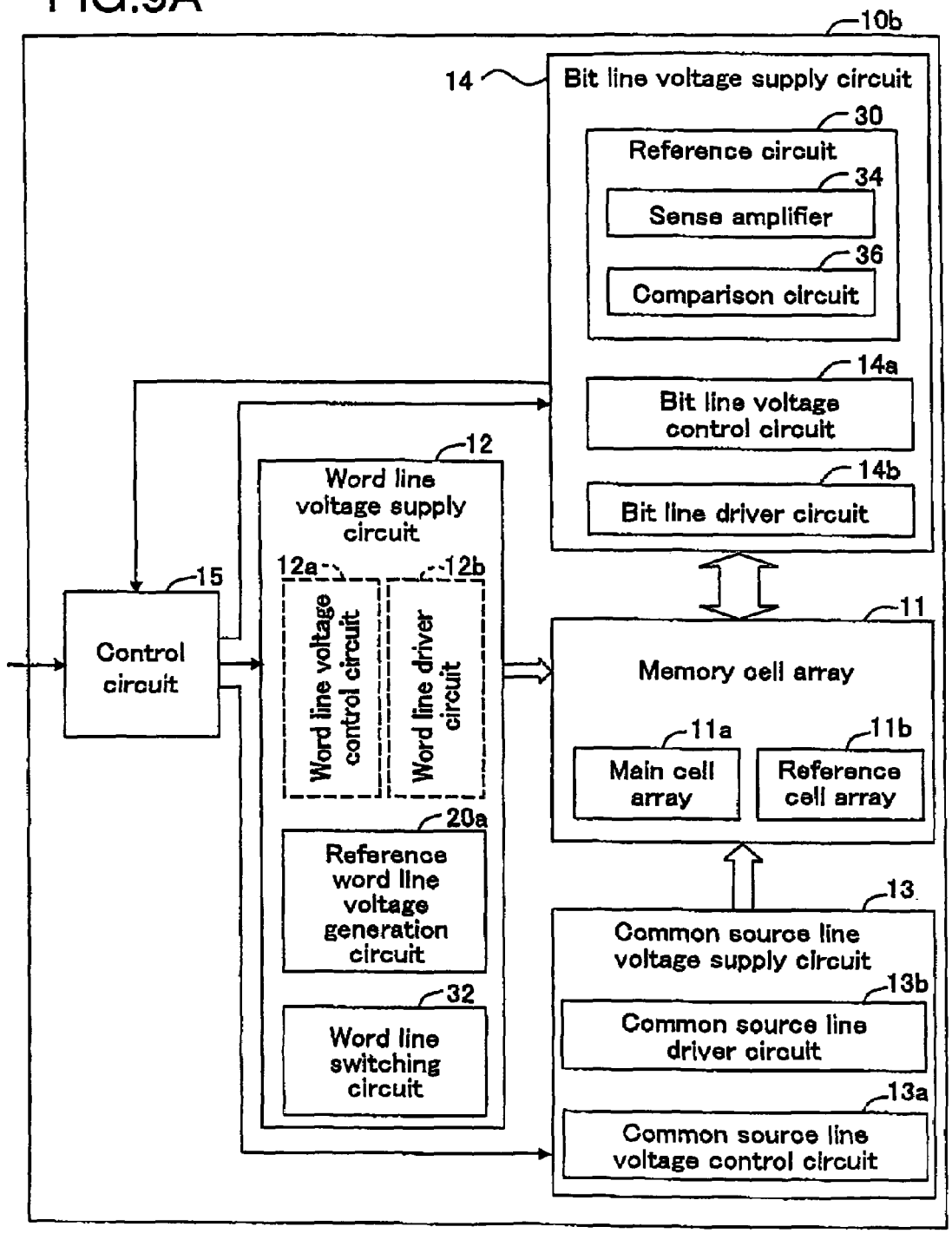
FIG. 9A is a block diagram illustrating a schematic structure of a flash memory as an example of a non-volatile semiconductor memory device according to a third example of the present invention.

FIG. 9A is a block diagram illustrating a schematic structure of a flash memory 10b as a non-volatile semiconductor memory device according to the third example of the present invention. The flash memory 10b has substantially the same structure as that of the flash memory 10 in the first example except for a reference word line voltage generation circuit 20a. Identical elements previously discussed with respect to FIGS. 1B and 9A bear identical reference numerals therewith and the detailed descriptions thereof will be omitted.

Figure 9B:
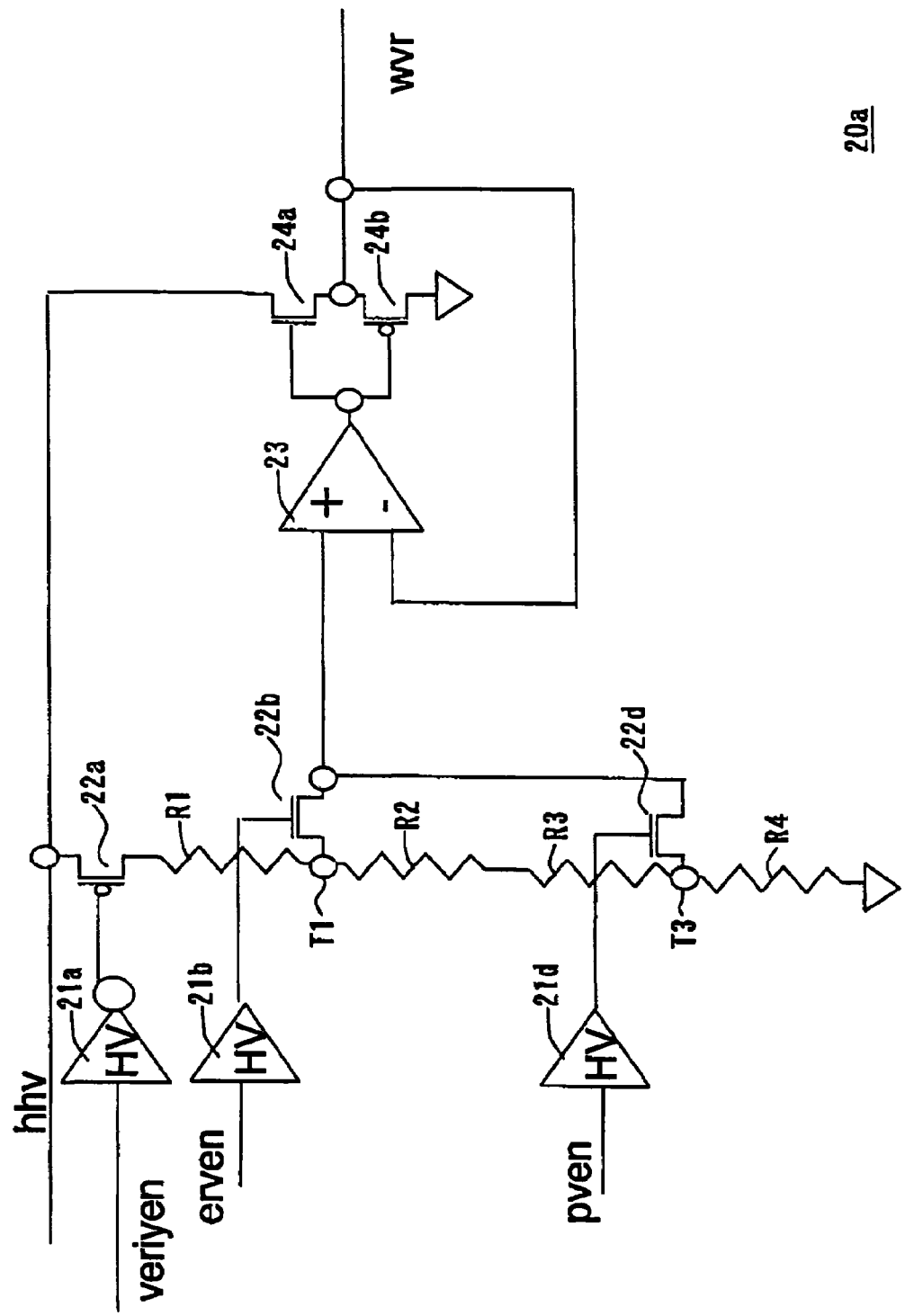
FIG. 9B is a circuit diagram illustrating an example of a reference word line voltage generation circuit used for a verification procedure in the flash memory according to the third example of the present invention.

FIG. 9B is a circuit diagram illustrating an example of the reference word line voltage generation circuit 20a shown in FIG. 9A. As shown in FIG. 9B, the reference word line voltage generation circuit 20a is different from the reference word line voltage generation circuit 20 (FIG. 3) mainly in that the reference word line voltage generation circuit 20a does not include the NMOS transistor 22c connected to the inverter-type level shifter circuit 21c, for receiving the pre-erasing write control signal preven, and also connected to the terminal T2. For the pre-erasing write operation, a reference word line signal wvr having a voltage of 5 V, which is the same as the voltage for the erasing operation, is output.

An erasing algorithm of a sequence of an erasing process of the flash memory 10b will be described in detail with reference to FIG. 10.

Figure 10:
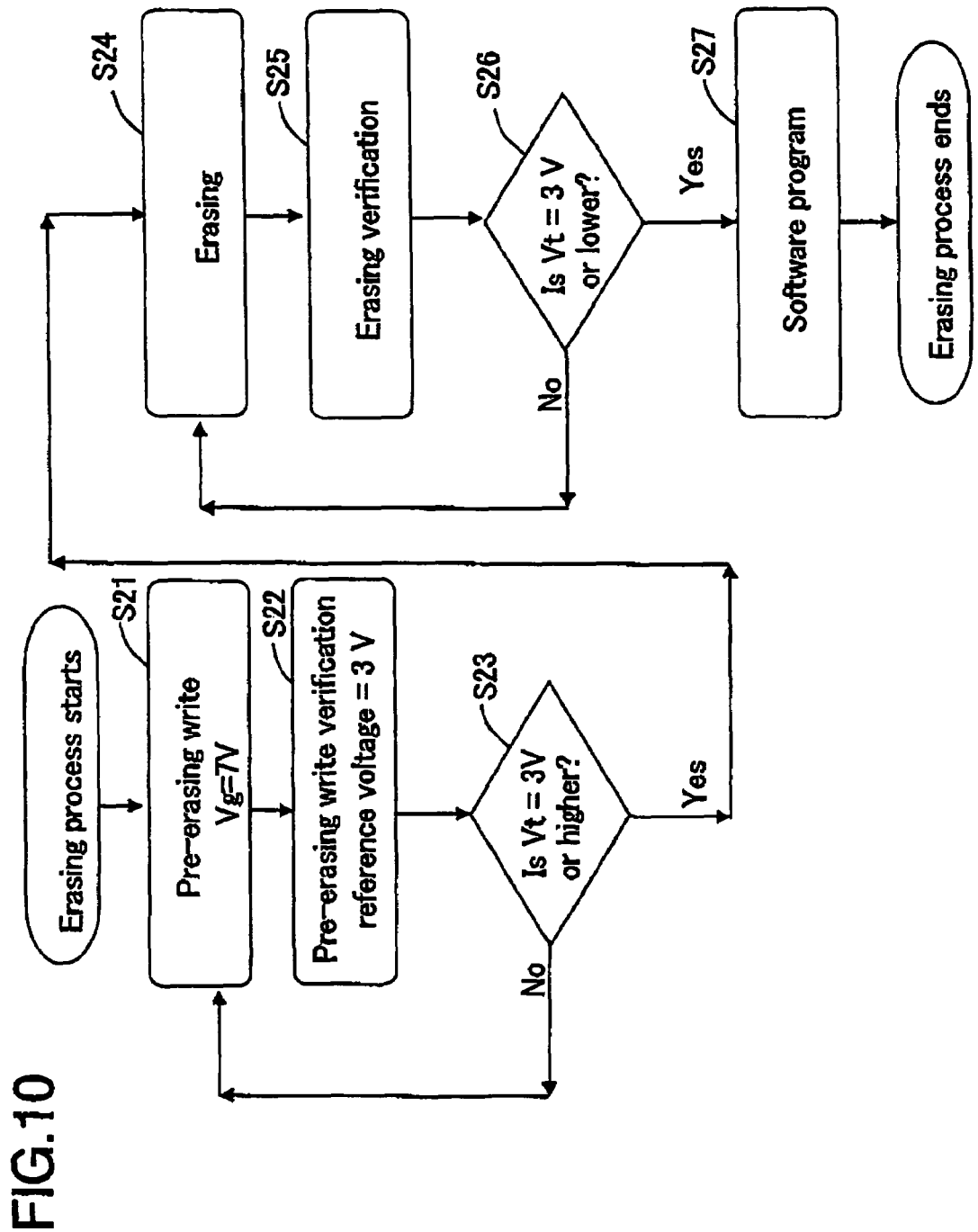
FIG. 10 is a flowchart illustrating an algorithm of a sequence of an erasing process of the flash memory according to the third example of the present invention.

FIG. 10 is a flowchart illustrating the erasing algorithm of the sequence of the erasing process of the flash memory 10b.

As shown in FIG. 17 and also as in the first example, the threshold voltages of the memory cello in a memory block before the erasing process are one of the two states mentioned above, i.e., the state of being 0.5 V to 3 V and the state of 5 V or higher.

As shown in FIG. 10, the erasing process starts with the pre-erasing write procedure in step S21, which is performed on all the memory cells in a memory block which is designated for erasing. The pre-erasing write procedure is performed in order to prevent excessive erasing. For the pre-erasing write procedure, the voltages (or a voltage condition) shown in Table 6 below ("pre-erasing write") are used. Table 6 shows the voltages when the channel erasing method is used.

TABLE 6

| | Control gate | Drain | Source | Substrate |
|---|---|---|---|---|
| Program write | 9 V | 5 V/0 V or Open | 0 V | 0 V |
| Erasing | −9 V | Open | Open | 6 V |
| Read | 5 V | 1 V | 0 V | 0 V |
| Pre-erasing write | 7 V | 5 V/0 V or Open | 0 V | 0 V |

The gate voltage Vg at this point is set to be lower than a voltage for program write procedure (9 V in this example); for example, 7 V. The gate voltage Vg is controlled by the word line voltage supply circuit 12. The drain voltage is 5 V in a memory cell to which writing is to be performed, and is 0 V or in an open state in a memory cell to which no writing is to be performed. The pre-erasing write procedure increases the threshold voltage of the memory cell. In Table 5, the voltages for the program write procedure, the erasing procedure, and the read procedure are the same as those shown in Table 2 (the channel erasing method).

Next, in step S22, the verification procedure is performed for verifying the pre-erasing write. For the verification procedure, the reference word line voltage generation circuit 20a (FIG. 9B) and the reference circuit 30 (FIG. 4) are used.

In the reference word line voltage generation circuit 20a, the erasing control signal erven becomes "high", and a reference word line signal wvr having a voltage lower than the voltage for the program write operation, for example, 5 V, which is the same as the voltage used when an erasing pulse is applied, is output.

The threshold voltage of the reference cell RM1 (FIG. 4) is 3 V and a word line voltage of 5 V is applied to the word line in the main cell array 11a. Therefore, in step S23, it is checked whether or not the threshold voltages of the main memory cells 50 in the main cell array 11a are 3 V or higher. When it is determined in step S23 that there is a main memory cell 50 having a threshold voltage of less than 3 V in the main cell array 11a, the pre-erasing write operation is performed again on that main memory cell 50. The above-described pre-erasing write procedure and the pre-erasing write verification procedure are repeated until all the main memory cells 50 in the memory block obtain a threshold voltage of 3 V or higher.

Figure 11:
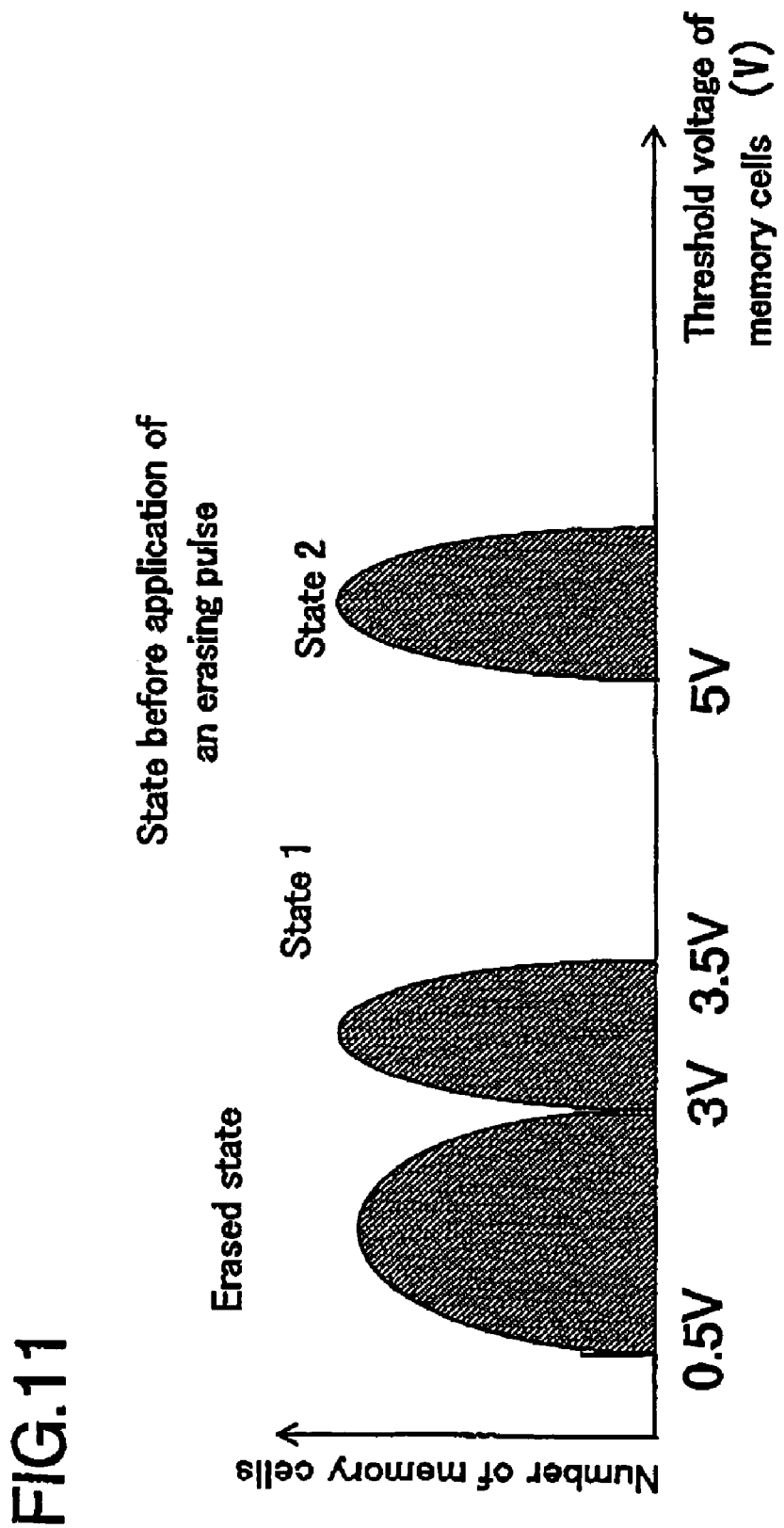
FIG. 11 is a graph illustrating a distribution of the threshold voltages of memory cells of the flash memory according to the third example of the present invention after the pre-erasing write operation and before an erasing pulse is applied.

After the pre-erasing write operation including the pre-erasing write procedure and the pre-erasing write verification procedure (before the erasing pulse is applied), the threshold voltages of the main memory cells in the memory block are distributed in one of the two states, i.e., the state of 3 V or higher and 3.5 V or lower (state 1 in FIG. 11) and the state of 5 V or higher (state 2 in FIG. 11). The main memory cells 50 which were in an erased state before the pre-erasing write operation was started are distributed in state 1 (3 V or higher and 3.5 V or lower). The main memory cells 50 which were already in a program written state before the pre-erasing write operation was started are distributed in state 2 (5 V or higher).

When it is determined in step S23 that all the main memory cells 50 in the memory block have a threshold voltage of 3 V or higher, the pre-erasing write procedure and the pre-erasing write verification procedure are terminated. Then, the erasing procedure is performed by applying an erasing pulse in step S24.

In step S24, an erasing pulse is applied to all the main memory cells 50 in the memory block with the voltages shown in Table 6.

At this point, a similar stress to that of the conventional art is applied to the memory cells distributed in state 2 (FIG. 11). According to the conventional art, as shown in Table 2, the pre-erasing write procedure is performed at the same voltages as those for the program write procedure. The gate voltage Vg is 9 V, and the reference voltage for the pre-erasing write verification procedure is 5 V.

By contrast, according to the third example, the pre-erasing write operation is performed on the main memory cells 50 distributed in state 2 (FIG. 11) with a gate voltage Vg of 7 V and a reference voltage of 3 V for the pre-erasing write verification procedure. Therefore, the threshold voltages of the main memory cells are slightly lower than those of the conventional art, and the electric field stress is alleviated as compared to the conventional art.

The main memory cells 50 which were in an erased state before the pre-erasing operation was started are distributed in state 1 (FIG. 11). When an erasing pulse is applied to these main memory cells 50, the charge amount of the floating gate is Qfg=0 V. The voltage Vfg of the floating gate when the erasing pulse is applied is:

0.6×(−9 V)+0.2×(6 V)−0 V=−4.2 V.

The electric field Eox which is applied to the tunnel oxide layer 54 is:

(6V−(−4.2 V))/100 Å=10.2 MeV.

According to the conventional art of performing the pre-erasing write procedure with the voltages shown in Table 2, the memory cells, to which the pre-erasing write procedure was performed, each receive a stress of 11.4 MeV. By contrast, according to the third example, the electric field applied to the tunnel oxide layer 54 of each memory cell 50 is reduced. Namely, application of the excessive electric field on the tunnel oxide layer 54 of each memory cell 50 is prevented.

As described above, for at least the memory cells 50 which were in the erased state before the pre-erasing write procedure was started, the number of holes and electrons trapped in the memory cells is reduced, and thus data retention is improved. As described above, the strength of data retention can be generally dealt using probability. Therefore, when the degree of stress received by the memory cell is lowered, the strength of data retention in a memory block or a chip is clearly improved.

Next, in step S25, the erasing verification procedure of verifying the erasing is performed as follows after the erasing pulse is applied.

In the reference word line voltage generation circuit 20a in FIG. 9B, the erasing control signal erven becomes "high", and a reference word line signal wvr having a voltage of 5 V is output.

In FIG. 4, the threshold voltage of the reference cell RM1 is 3 V and a word line voltage of 5 V is applied to the word line in the main cell array 11a. Therefore, in step S26, it is checked whether or not the threshold voltages of the main memory cells 50 in the main cell array 11a are 3 V or lower. When it is determined in step S26 that there is a main memory cell 50 having a threshold voltage of more than 3 V in the main cell array 11a, the erasing operation is performed again on that main memory cell 50 by applying an erasing pulse. The above-described erasing procedure and the erasing verification procedure are repeated until all the main memory cells 50 in the memory block obtain a threshold voltage of 3 V or lower.

An erased state obtained after the erasing operation is performed on memory cells having a threshold voltage of about 3 V will be described.

Figure 12:
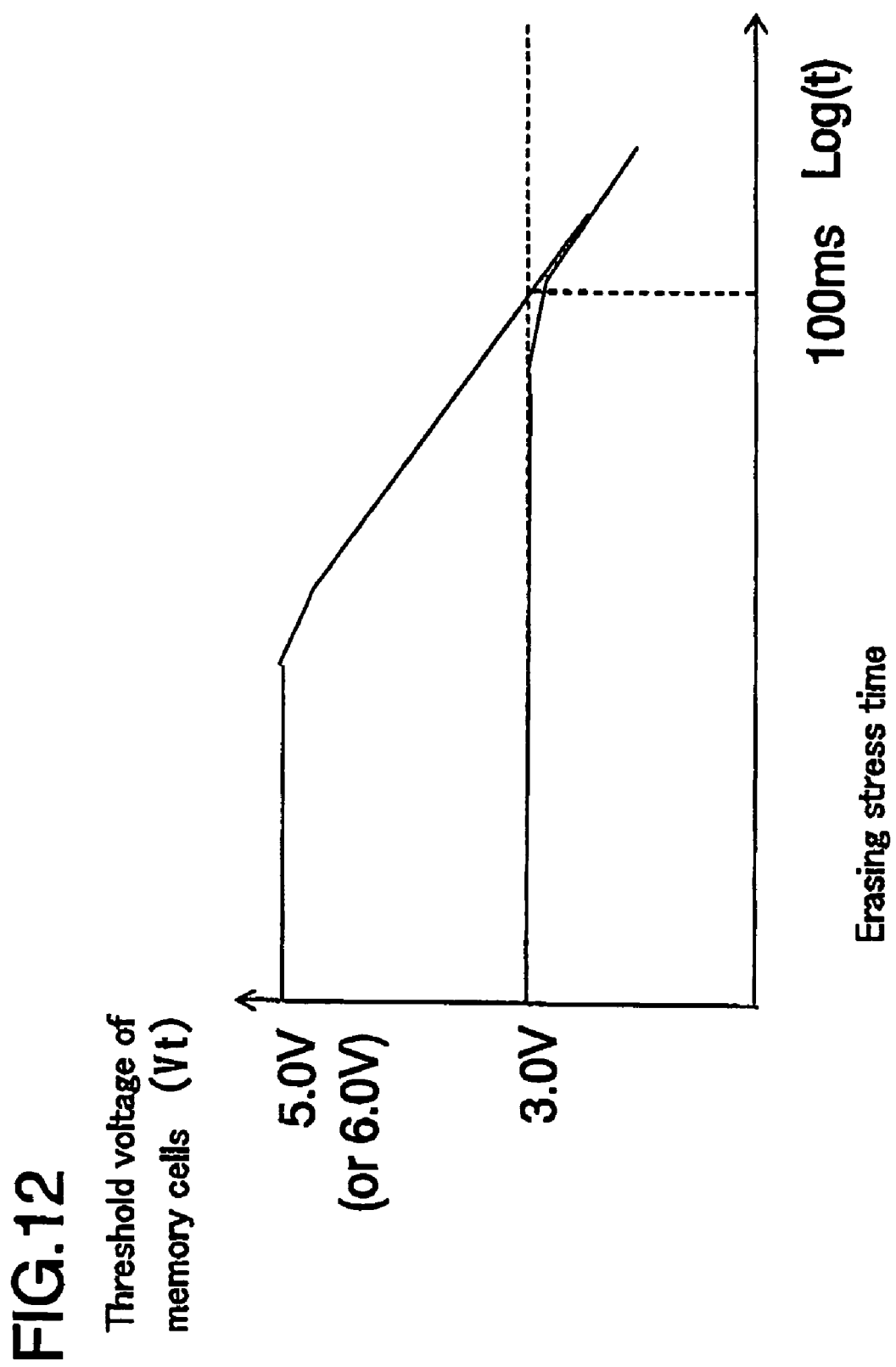
FIG. 12 is a graph illustrating the relationship between the erasing stress time and the threshold voltages of the memory cells having the threshold voltages of around 3 V to 5 V (or 6 V)

FIG. 12 is a graph illustrating the relationship between the erasing stress time and the threshold voltage of the memory cells. The vertical axis represents the threshold voltage of the memory cells, and the horizontal axis represents the erasing pulse application time (i.e., erasing stress time).

It is understood from FIG. 12 that the threshold voltage obtained by applying an erasing stress for 100 ms to a memory cell having a threshold voltage of 3 V or higher before the application of the erasing pulse, and the threshold obtained by applying the erasing stress for 100 ms to a memory cell having a threshold voltage of about 5 V before the application of the erasing pulse, are substantially the same as each other. Thus, the problem of excessive erasing does not occur.

When it is determined in step S26 that all the main memory cells in the memory block obtain a threshold voltage of 3 V or lower, the erasing procedure of applying an erasing pulse and the erasing verification procedure are terminated.

In step S27, it is checked by a sequence of software (software program) whether or not there is a main memory cell having a threshold voltage of 0.5 V or lower. When there 18 such a main memory cell, that main memory cell is adjusted to have a threshold voltage of 0.5 V or higher and 3 V or lower. When the number of the main memory cells having a threshold voltage of 0.5 V or lower becomes zero, this sequence is terminated, and the erasing process is terminated.

In the third example, au in the second example, a reference circuit using a plurality of reference cells having different threshold voltages are usable. In this case, the pre-erasing write operation can be performed with a reference voltage which is lower than that for the program write operation.

Figure 13:
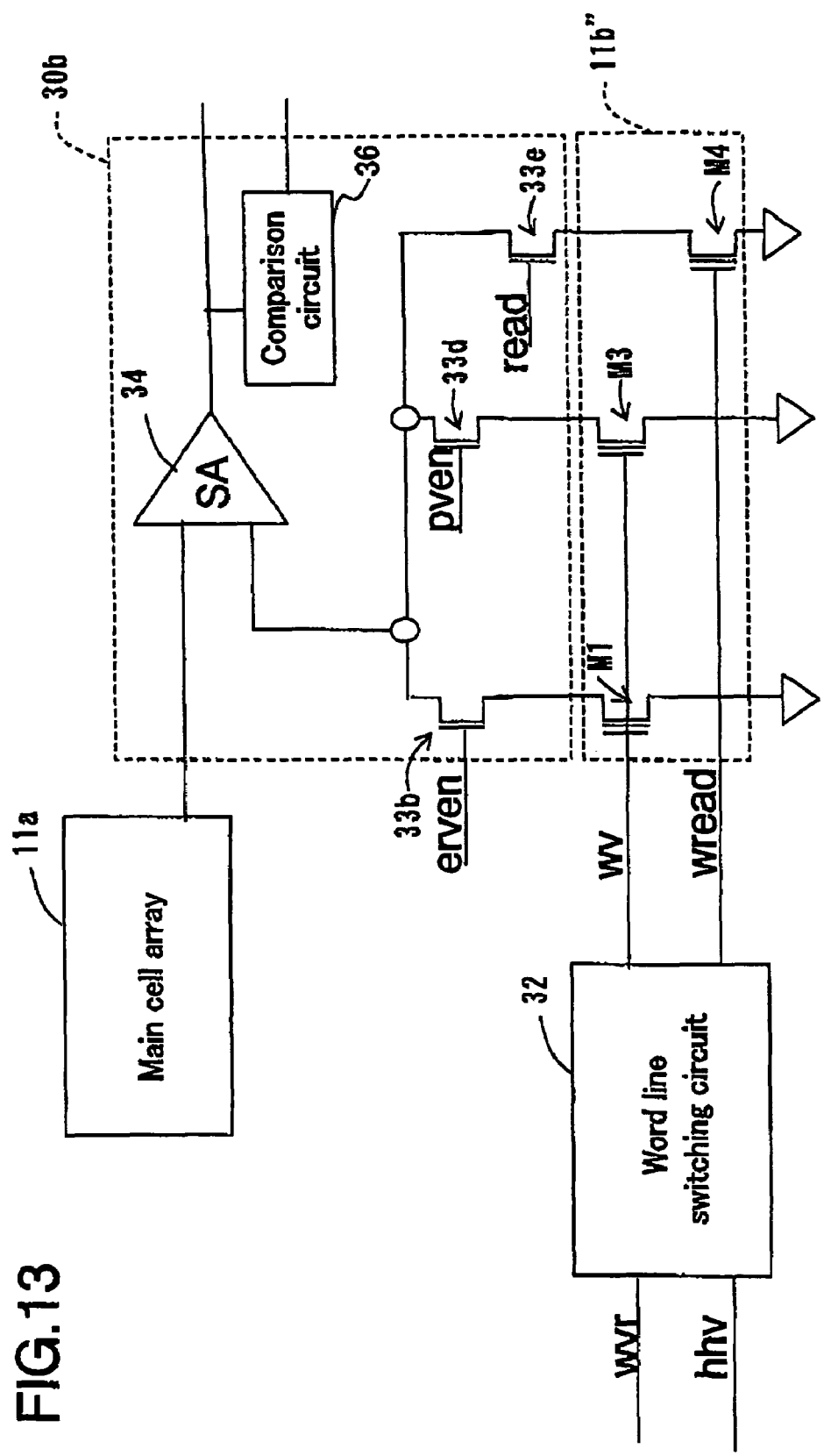
FIG. 13 is a circuit diagram illustrating an example of a reference circuit and the vicinity thereof used for a verification procedure in another flash memory according to the third example of the present invention.

FIG. 13 to a circuit diagram illustrating an example of a reference circuit 30b and the vicinity thereof in another flash memory according to the third example of the present invention. The reference circuit 30b has substantially the same structure as that of a general reference circuit. The flash memory has substantially the same structure as that of the flash memory 10 in the first example except for the reference circuit 30b.

As shown in FIG. 13, the reference circuit 30b is different from the reference circuit 30a (FIGS. 8A and 8B) mainly in that the reference circuit 30b does not include the NMOS transistor 33a for receiving the pre-erasing write control signal preven at a gate thereof and does not include the reference cell M2 connected to the NMOS transistor 33a. The pre-erasing write verification procedure is performed using the reference cell M1 which is also used for the erasing verification procedure (after the erasing pulse is applied).

Next, an erasing algorithm of a sequence of an erasing process of the flash memory will be described in detail with reference to FIG. 10, which was used above for the flash memory 10b.

As shown in FIG. 17 and also as in the first example, the threshold voltages of the memory cells in a memory block before the erasing process are one of the two states mentioned above, i.e., the state of being 0.5 V to 3 V and the state of 5 V or higher.

As shown in FIG. 10, the erasing process starts with the pre-erasing write procedure in step S21, which is performed on all the memory cells in a memory block which is designated for erasing. The pre-erasing write procedure is performed in order to prevent excessive erasing. For the pre-erasing write procedure, the voltages shown in Table 6 above ("pre-erasing write") are used. The gate voltage Vg at this point is set to be lower than a voltage for the program write procedure (9 V in this example); for example, 7 V. The gate voltage Vg is controlled by the word line voltage supply circuit 12. The drain voltage is 6 V (or 5 V as in Table 6) in a memory cell to which writing is to be performed, and is 0 V or in an open state in a memory cell to which no writing is to be performed. The pre-erasing write procedure increases the threshold voltage of the memory cell.

Next, in step S22, the verification procedure is performed for verifying the pre-erasing write. For the verification procedure, the reference circuit 30b (FIG. 13) is used.

In the reference circuit 30b, the pre-erasing write control signal proven becomes "high", and the reference cell M1 having a threshold voltage of 3 V is selected. A word line voltage of 5 V is applied to the word lines in the main cell array 11a and the reference cell array 11b. Therefore, in step S23, it is checked whether or not the threshold voltages of the main memory cells 50 in the main cell array 11a are 3 V or higher. When it is determined in step S23 that there is a main memory cell 50 having a threshold voltage of less than 3 V in the main cell array 11a, the pre-erasing write operation is performed again on that main memory cell 50. The above-described pre-erasing write procedure and the pre-erasing write verification procedure are repeated until all the main memory cells 50 in the memory block obtain a threshold voltage of 3 V or higher.

After the pre-erasing write operation (before the erasing pulse is applied), the threshold voltages of the main memory cells in the memory block are distributed in one of the two states, i.e., the state of 3 V or higher and 3.5 V or lower (state 1 in FIG. 11) and the state of 5 V or higher (state 2 in FIG.

11). The main memory cells 50 which were in an erased state before the pre-erasing write operation was started are distributed in state 1 (3 V or higher and 3.5 V or lower). The main memory cells 50 which were already in a program written state before the pre-erasing write operation was started are distributed in state 2 (5 V or higher).

When it is determined in step S23 that all the main memory cells 50 in the memory block have a threshold voltage of 3 V or higher, the pre-erasing write procedure and the pre-erasing write verification procedure are terminated. Then, the erasing procedure is performed by applying an erasing pulse to all the main memory cells 50 in the memory block in step S24.

Steps S24 through S27 are performed in the same manner as those for the flash memory 10b using the reference word line voltage generation circuit 20a (FIG. 9B) and the reference circuit 30 (FIG. 4), and will not be described here. As in the above described examples, for at least the memory cells which were in an erased state before the erasing pulse was applied, the number of holes and electrons trapped in the memory cells is reduced, and thus data retention is improved.

EXAMPLE 4

In the first through third examples, a binary memory to which binary (i.e., 1-bit) information can be written and from which binary (i.e., 1-bit) information can be read are described. In a fourth example of the present invention, a multiple bit memory to which 2- or more bit information can be written and from which 2- or more bit information can be read will be described. Here, a quaternary flash memory to which 2-bit information can be written and from which 2-bit information can be read will be described.

In the fourth example, the voltages for the pre-erasing write operation are controlled to be different from those for writing information having the highest threshold voltage VtH of the memory cell in the program write operation, so that the threshold voltages of the memory cells are lowered. This control is performed in order to reduce the excessive stress applied on the tunnel oxide layer of each memory cell at the time of application of an erasing pulse, as described with reference to FIGS. 19 through 21 regarding the conventional art.

Specifically, the gate voltage which is applied to a gate (control gate) of the memory cell for the pre-erasing write procedure is set to be lower than the gate voltage used for writing information having the highest threshold voltage VtH of the memory cell in the program write procedure. The reference voltage for the pre-erasing write verification procedure is also set to be lower than the reference voltage used for writing information having the highest threshold voltage VtH of the memory cell in the program write verification procedure.

Such a gate voltage can be generated by a word line voltage supply circuit as in the first through third examples. The reference voltage can be generated by a reference word line voltage generation circuit and a reference circuit as in the first through third examples.

Next, an erasing algorithm of a sequence of an erasing process of the flash memory in the fourth example will be described in detail with reference to FIG. 14.

Figure 14:
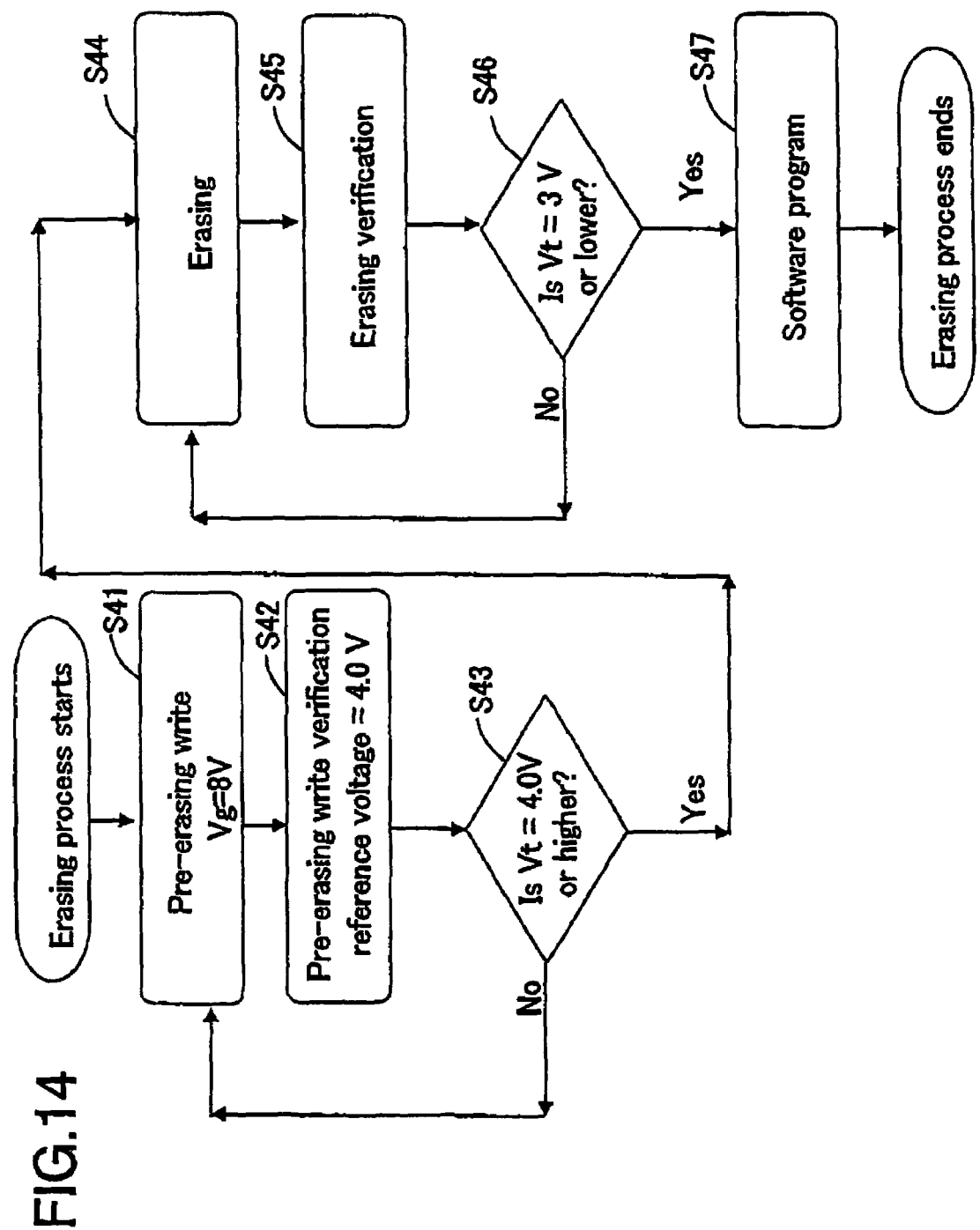
FIG. 14 is a flowchart illustrating an algorithm of a sequence of an erasing process of a flash memory according to a fourth example of the present invention.

FIG. 14 is a flowchart illustrating the erasing algorithm of the sequence of the erasing process of the flash memory in this example.

Figure 19:
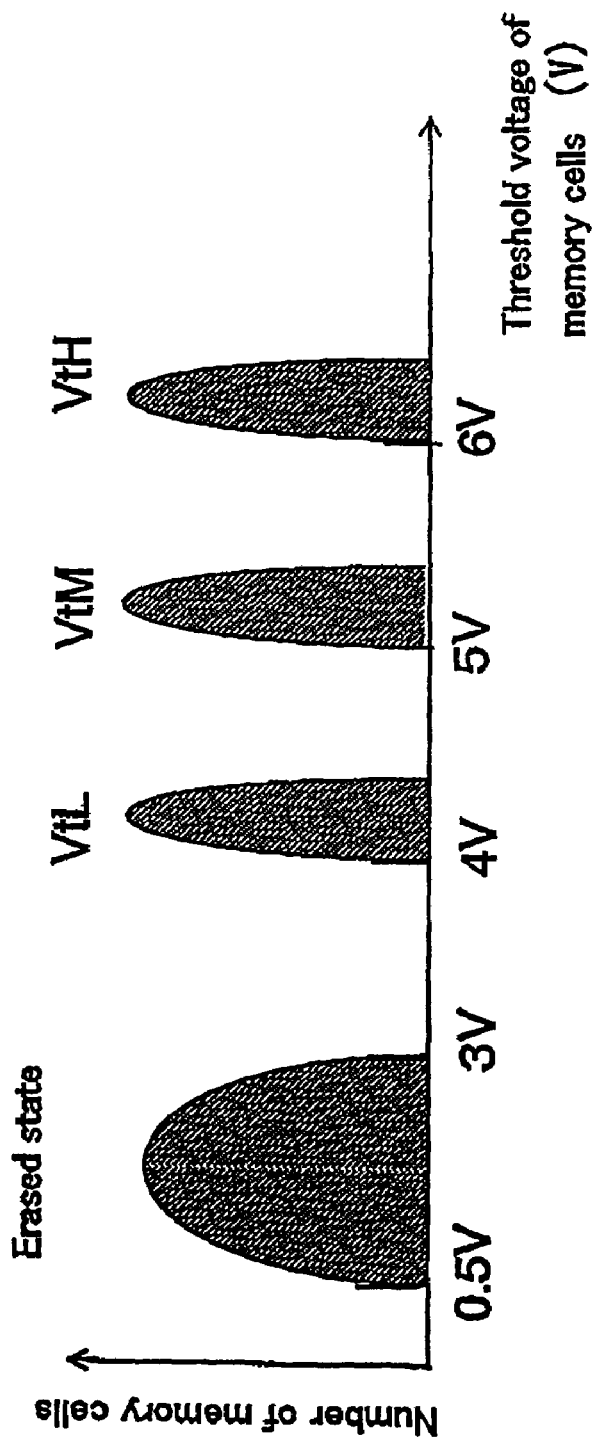
FIG. 19 is a graph a distribution of the threshold voltages of memory cells in a conventional multiple bit flash memory.
Figure 20:
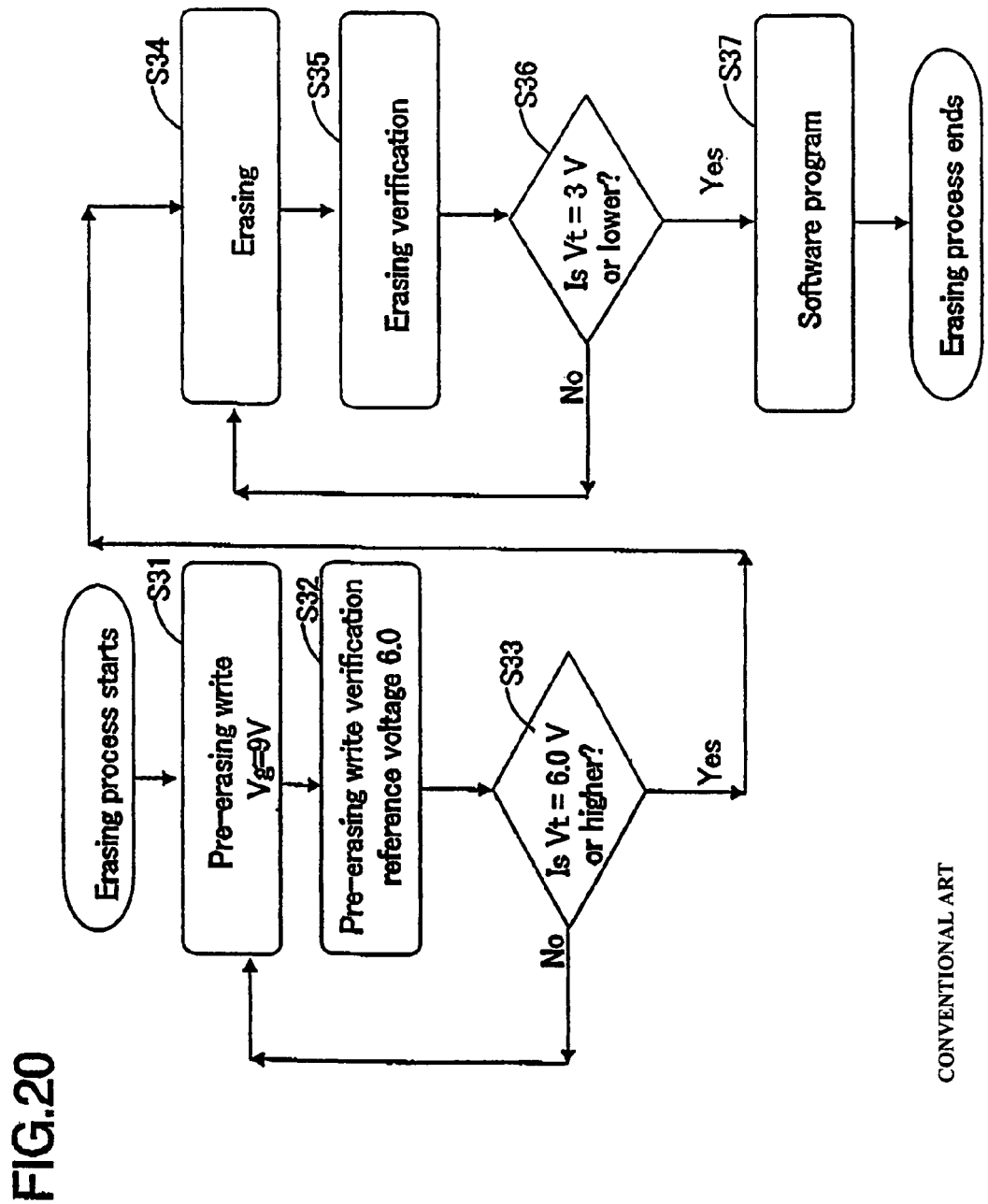
FIG. 20 is a flowchart illustrating an algorithm of a sequence of an erasing process of a conventional multiple bit flash memory.

The threshold voltages of the memory cells in a memory block before the erasing process are one of the four states shown in FIG. 19, i.e., erased state, written state VtL, written state VtM, and written state VtH.

As shown in FIG. 14, the erasing process starts with the pre-erasing write procedure in step S41, which is performed on all the memory cells in a memory block which is designated for erasing. The pre-erasing write procedure is performed in order to prevent excessive erasing. For the pre-erasing write procedure, the voltages (or a voltage condition) shown in Table 7 below ("pre-erasing write") are used. The gate voltage Vg at this point is set to be lower than a voltage for writing information having the highest threshold voltage in the program write operation (9 V in this example); for example, 8 V. The gate voltage Vg is controlled by the word line voltage supply circuit 12. The drain voltage is 6 V (or 5 V as in Table 7) in a memory cell to which writing is to be performed, and is 0 V or in an open state in a memory cell to which no writing is to be performed. The pre-erasing write procedure increases the threshold voltage of the memory cell. In Table 7, the voltages for the program write procedure, the erasing procedure, and the read procedure are the same as those shown in Table 4 (the channel erasing method).

TABLE 7

|  | Control gate | Drain | Source | Substrate |
| --- | --- | --- | --- | --- |
| Program write | 7–9 V | 5 V/0 V or Open | 0 V | 0 V |
| Erasing | −9 V | Open | Open | 6 V |
| Read | 5 V | 1 V | 0 V | 0 V |
| Pre-erasing write | 8 V | 5 V/0 V or Open | 0 V | 0 V |

Next, in step S42, the verification procedure is performed for verifying the pre-erasing write. For the verification procedure, a reference voltage of 4 V is used, which is the same as the reference voltage for writing information having the lowest threshold voltage VtL in the program write operation. In step S43, it is checked whether or not the threshold voltages of the main memory cells 50 in the main cell array 11a are 4 V or higher. When it is determined in step S43 that there is a main memory cell 50 having a threshold voltage of less than 4 V in the main cell array 11a, the pre-erasing write operation is performed again on that main memory cell 50. The above-described pre-erasing write procedure and the pre-erasing write verification procedure are repeated until all the main memory cells 50 in the memory block obtain a threshold voltage of 4 V or higher. The reference voltage in the pre-erasing write operation may be any voltage which is lower than the voltage which is written for information having the highest threshold voltage of the memory cell in the program write operation. For example, the reference voltage may be 3 V, which is the same as the voltage used for the erasing verification procedure as in the third example. The reference voltage may be about 3.5 V as in the first and second examples. In this case, the gate voltage for the pre-erasing write procedure may be, for example, 7.5 V or 7 V.

Figure 15:
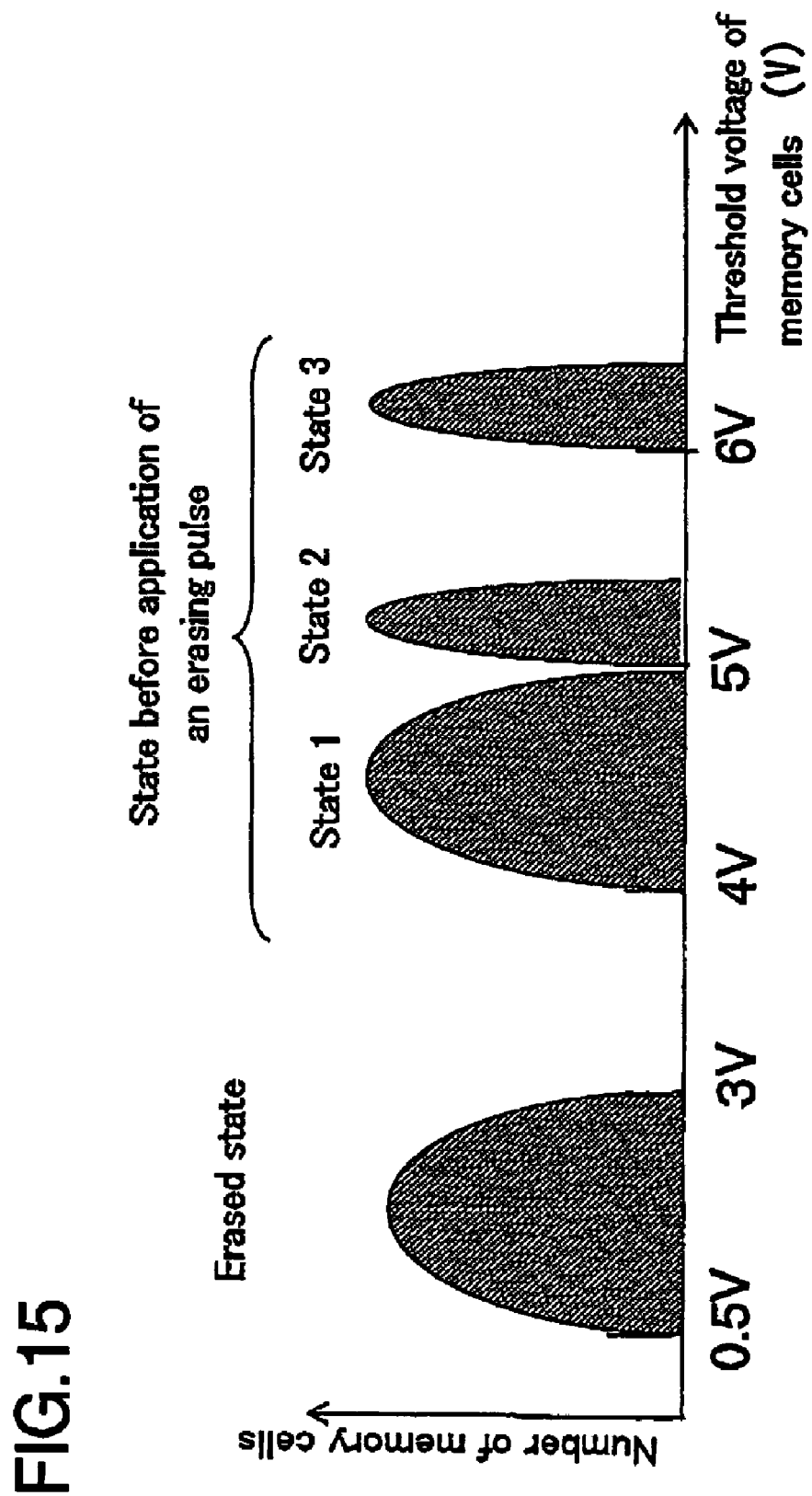
FIG. 15 is a graph illustrating a distribution of the threshold voltages of memory cells of the flash memory according to the fourth example of the present invention after the pre-erasing write operation and before an erasing pulse is applied.

After the pre-erasing write operation (before the erasing pulse is applied), the threshold voltages of the main memory cells in the memory block are distributed in one of the three states shown in FIG. 15, i.e., the state of 4 V or higher (state 1 in FIG. 15), the state of 5 V or higher (state 2 in FIG. 15), and the state of 6 V or higher (state 3 in FIG. 15).

The main memory cells 50 which were in the erased state or in the written state VtL before the pre-erasing write operation was started are distributed in state 1 (4 V or higher). The main memory cells 50 which were already in the written state VtM or VtH of 4 V or higher before the pre-erasing write operation was started are distributed in state 2 (5 V or higher) or state 3 (6 V or higher), respectively.

When it is determined in step S43 that all the main memory cells 50 in the memory block have a threshold voltage of 4 V or higher, the pre-erasing write procedure and the pre-erasing write verification procedure are terminated. Then, the erasing procedure is performed by applying an erasing pulse in step S44.

In step S44, an erasing pulse is applied to all the main memory cells 50 in the memory block with the voltages shown in Table 7.

At this point, a similar stress to that of the conventional art is applied to the memory cells distributed in state 2 or state 3 (FIG. 15). According to the conventional art, as shown in Table 4, the pre-erasing write procedure is performed at the same voltages as the voltage for writing information having the highest threshold voltage in the program write procedure. The gate voltage Vg is 9 V, and the reference voltage for the pre-erasing write verification procedure is 6 V.

By contrast, according to the fourth example, the pre-erasing write operation is performed on the main memory cells 50 with a gate voltage Vg of 8 V and a reference voltage of 4 V for the pre-erasing write verification procedure. Therefore, the threshold voltages of the main memory cells are slightly lower than those of the conventional art, and the electric field stress is alleviated as compared to the conventional art.

The main memory cells 50 which were in an erased state or in the written state VtL before the pre-erasing procedure was started are distributed in state 1 (FIG. 15). When an erasing pulse is applied to these main memory cells 50, the charge amount of the floating gate is Qfg=−0.6 V (or −0.3 V). The voltage Vfg of the floating gate when the erasing pulse is applied is:

0.6×(−9 V)+0.2×(6 V)−0.6 V=−4.8 V.

The electric field Eox which is applied to the tunnel oxide layer is:

(6V−(−4.8 V))/100 Å=10.8 MeV.

According to the conventional art of performing the pre-erasing write procedure with the voltages shown in Table 4, all the memory cells including the memory cells, which were in the erased state or in the written state VtL before the pre-erasing write procedure was started, each receive a stress of 12 MeV. By contrast, according to the fourth example, the electric field applied to the tunnel oxide layer of each memory cell 50 is reduced. Namely, application of the excessive electric field on the tunnel oxide layer of each memory cell 50 is prevented.

As described above, for at least the memory cells 50 which were in the erased state or in the written state VtL before the pre-erasing write procedure was started, the number of holes and electrons trapped in the memory cells is reduced, and thus data retention is improved. As described above, the strength of data retention can be generally dealt using probability. Therefore, when the degree of stress received by the memory cell is lowered, the strength of data retention in a memory block or a chip is clearly improved.

Next, in step S45, the erasing verification procedure of verifying the erasing is performed as follows.

In the reference word line voltage generation circuit 20 in FIG. 3, the erasing control signal erven becomes "high", and a reference word line signal wvr having a voltage of 5 V is output.

In FIG. 4, the threshold voltage of the reference cell RM1 is 3 V, and a word line voltage of 5 V is applied to the word line in the main cell array 11a. Therefore, in step S46, it is checked whether or not the threshold voltages of the main memory cells 50 in the main cell array 11a are 3 V or lower. When it is determined in step S46 that there is a main memory cell 50 having a threshold voltage of more than 3 V in the main call array 11a, the erasing operation is performed again on that main memory cell 50 by applying an erasing pulse. The above-described erasing procedure and the erasing verification procedure are repeated until all the main memory cells 50 in the memory block obtain a threshold voltage of 3 V or lower. The verification procedure may be performed using the reference circuit as in the second example, or using the reference word line voltage generation circuit and the reference circuit as in the third example.

An erased state obtained after the erasing process is performed on memory cells having a threshold voltage of about 3 V will be described.

It is understood from FIG. 12 that the threshold voltage obtained by applying an erasing stress for 100 ms to a memory cell having a threshold voltage of 3 V or higher before the application of the erasing pulse, and the threshold obtained by applying the erasing stress for 100 ms to a memory cell having a threshold voltage of about 6 V before the application of the erasing pulse, are substantially the same as each other. Thus, the problem of excessive erasing does not occur.

When it is determined in step S46 that all the main memory cells in the memory block obtain a threshold voltage of 3 V or lower, the erasing procedure of applying an erasing pulse and the erasing verification procedure are terminated.

In step S47, it is checked by a sequence of software (software program) whether or not there is a main memory cell having a threshold voltage of 0.5 V or lower. When there is such a main memory cell, that main memory cell is adjusted to have a threshold voltage of 0.5 V or higher and 3 V or lower. When the number of the main memory cells having a threshold voltage of 0.5 V or lower becomes zero, this sequence is terminated, and the erasing process is terminated.

As described above, for a multiple bit flash memory, the pre-erasing write procedure is performed using a voltage which is lower than the gate voltage for writing information having the highest threshold voltage of the memory cell in the program write procedure, and the pre-erasing write verification procedure is performed using a reference voltage which is lower than the reference voltage for verifying the above program write procedure. Thus, the stress applied on the tunnel oxide layer 54 by the application of the erasing pulse is alleviated, and thus the strength of data retention is improved.

According to the present invention, in a binary flash memory, memory cells which were in an erased state before an erasing pulse was applied are protected against an excessive stress at the time of application of the erasing pulse. Thus, the number of holes and electrons trapped in the tunnel oxide layer of the memory cells is reduced at the time of application of the erasing pulse. In a multiple bit flash memory also, memory cells which were in an erased state or a low threshold voltage state before an erasing pulse was applied are protected against an excessive stress at the time of application of the erasing pulse. Thus, the number of holes and electrons trapped in the tunnel oxide layer of the memory cells is reduced at the time of application of the erasing pulse. The strength of data retention can be generally dealt using probability. Therefore, when the degree of stress received by the memory cell is lowered, the strength of data retention in a memory block or a chip is clearly improved. Thus, a highly reliable non-volatile semiconductor memory device is provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile semiconductor memory device, comprising:
    a memory cell array including a plurality of memory cells, wherein information is writable to each of the plurality of memory cells and information is erasable from each of the plurality of memory cells, and the plurality of memory cells are grouped into at least one memory block; and
    a write and erasing section for performing a program write operation to a prescribed memory cell in one memory block in a prescribed voltage condition and for performing an erasing operation with respect to the memory cells in the one memory block, wherein the write and erasing section performs a pre-erasing write operation to the memory cells in the one memory block in a voltage condition, which is different from the prescribed voltage condition having a highest threshold voltage in the program write operation, before the erasing operation is performed with respect to the memory cells in the one memory block.

2. The non-volatile semiconductor memory device according to claim 1, wherein:
    the plurality of memory cells each have a threshold voltage which varies in accordance with the voltage condition; and
    the write and erasing section sets a voltage condition for the pre-erasing write operation, such that the threshold voltages of the memory cells in the one memory block after the pre-erasing write operation are lower than the threshold voltages of the memory cells in the one memory block after the program write operation, and such that excessive erasing does not occur in the memory cells in the one memory block in the erasing operation.

3. The non-volatile semiconductor memory device according to claim 1, wherein:
    the plurality of memory cells each include a control terminal; and
    the write and erasing section sets a voltage condition for the pre-erasing write operation, such that the voltages applied to the control terminals of the memory cells in the one memory block in the pre-erasing write operation are lower than the voltages applied to the control terminals of the memory cells in the one memory block in the program write operation.

4. The non-volatile semiconductor memory device according to claim 1, wherein:
    the write and erasing section performs, in the program write operation, a program write procedure of writing a program and a program write verification procedure of verifying the program write;
    the write and erasing section performs, in the pre-erasing write operation, a pre-erasing write procedure of performing pre-erasing write and a pre-erasing write verification procedure of verifying the pre-erasing write; and
    the write and erasing section sets a voltage condition for the pre-erasing write operation such that a reference voltage used in the pre-erasing write verification procedure is lower than a reference voltage used in the program write verification procedure.

5. The non-volatile semiconductor memory device according to claim 4, wherein:
    the memory cell array further includes a reference cell;
    the reference cell includes a control terminal; and
    the write and erasing section includes a reference control line voltage generation circuit for supplying, in the pre-erasing write verification procedure, the control terminal of the reference cell with a reference control line voltage which is different from a voltage used in the program write verification procedure.

6. The non-volatile semiconductor memory device according to claim 5, wherein:
    the memory cell array further includes a reference cell array including a plurality of reference cells;
    the plurality of reference cells have different reference threshold voltages;
    the plurality of reference cells each include a control terminal; and
    in the pre-erasing write verification procedure, the reference control line voltage generation circuit supplies the control terminal of a reference cell in the reference cell array, which is the same as a reference cell used in the program write verification procedure, with a reference control line voltage which is different from a reference control line voltage used in the program write verification procedure.

7. The non-volatile semiconductor memory device according to claim 5, wherein:
    the memory cell array further includes a reference cell array including a plurality of reference cells;
    the plurality of reference cells have different reference threshold voltages;
    the plurality of reference cells each include a control terminal; and
    in the pre-erasing write verification procedure, the reference control line voltage generation circuit supplies the control terminal of a reference cell in the reference cell array, which is different from the reference cell used in the program write verification procedure, with a reference control line voltage which is different from a reference control line voltage used in the program write verification procedure.

8. The non-volatile semiconductor memory device according to claim 5, wherein:
    the memory call array further includes a reference cell array including a plurality of reference cells;
    the plurality of reference cells have different reference threshold voltages;
    the plurality of reference cells each include a control terminal; and
    in the pre-erasing write verification procedure, the reference control line voltage generation circuit supplies the control terminal of a reference cell in the reference cell array, which is different from a reference cell used in the program write verification procedure, with a reference control line voltage which is the same as a reference control line voltage used in the program write verification procedure.

9. The non-volatile semiconductor memory device according to claim 4, wherein:
the write and erasing section performs, in the erasing operation, an erasing procedure of performing erasing and an erasing verification procedure of verifying the erasing; and
the write and erasing section uses, in the erasing verification procedure, a reference voltage which is the same as the reference voltage used in the pre-erasing write verification procedure.

10. The non-volatile semiconductor memory device according to claim 1, wherein multiple bit information of at least 2 bits is writable to each of the plurality of memory cells in the memory cell array and is erasable from each of the plurality of memory cells in the memory cell array.

11. The non-volatile semiconductor memory device according to claim 10, wherein;
the plurality of memory cells each have a threshold voltage which varies in accordance with the voltage condition;
multiple bit information is written to each of the plurality of memory cells in accordance with the threshold voltage; and
the write and erasing section sets a voltage condition for the pre-erasing write operation, such that the voltage condition for the pre-erasing write operation is different from a voltage condition for writing information having a highest threshold voltage in the program write operation.

12. The non-volatile semiconductor memory device according to claim 10, wherein the write and erasing section sets a voltage condition for the pre-erasing write operation, such that the threshold voltages of the memory cells in the one memory block after the pre-erasing write operation are lower than the threshold voltages of the memory cells in the one memory block after the information having a highest threshold voltage is written in the program write operation, and such that excessive erasing does not occur in the memory cells in the one memory block in the erasing operation.

13. The non-volatile semiconductor memory device according to claim 10, wherein:
the plurality of memory cells each include a control terminal; and
the write and erasing section sets a voltage condition for the pre-erasing write operation, such that the voltages applied to the control terminals of the memory cells in the one memory block in the pre-erasing write operation are lower than the voltages applied to the control terminals of the memory cells in the one memory block for writing information having a highest threshold voltage in the program write operation.

14. The non-volatile semiconductor memory device according to claim 10, wherein:
the write and erasing section sets the prescribed voltage condition for the program write operation such that a reference voltage used in the pre-erasing write verification procedure is lower than a reference voltage used for writing information having a highest threshold voltage in the program write verification procedure.

15. An erasing control method for a non-volatile semiconductor memory device including a memory cell array including a plurality of memory cells, wherein the plurality of memory cells are grouped into at least one memory block, the erasing method comprising the steps of:
performing a program write operation to a prescribed memory cell in one memory block in a prescribed voltage condition;
performing an erasing operation with respect to the memory cells in the one memory block; and
performing a pre-erasing write operation to the memory cells in the one memory block in a voltage condition, which is different from the prescribed voltage condition having a highest threshold voltage in the program write operation, before the erasing operation is performed with respect to the memory cells in the one memory block.

16. The erasing control method according to claim 15, wherein:
the step of performing the pre-erasing write operation includes the step of performing the pre-erasing write operation in a voltage condition which is lower than the prescribed voltage condition.

17. The erasing control method according to claim 15, wherein:
the plurality of memory cells each include a control terminal; and
the step of performing the pro-erasing write operation includes the step of applying voltages, which are lower than the voltages applied in the program write operation, to the control terminals of the memory cells in the one memory block.

18. The erasing control method according to claim 15, wherein:
the step of performing the pre-erasing write operation includes the steps of:
performing the pre-erasing write procedure to the memory cells in the one memory block; and
performing the pre-erasing write verification procedure of verifying the pre-erasing write.

19. The erasing control method according to claim 18, wherein the step of performing the pre-erasing write verification procedure includes the step of using a reference voltage which is lower than a reference voltage used in the program write operation.

20. The erasing control method according to claim 15, further comprising the step of performing the erasing operation with respect to the memory cells in the one memory block by applying erasing pulses to the memory cells in the one memory block.

21. The erasing control method according to claim 15, wherein multiple bit information of at least 2 bits is writable to each of the plurality of memory cells in the memory cell array and is erasable from each of the plurality of memory cells in the memory cell array.

22. The erasing control method according to claim 21, wherein:
the plurality of memory cells each include a control terminal;
the step of performing the program write operation includes the step of performing a program write procedure and the step of performing a program write verification procedure of verifying the program write;
the step of performing the pre-erasing write operation includes the step of performing a pre-erasing write procedure and the step of performing a pre-erasing write verification procedure of verifying the pre-erasing write;
the step of performing the pre-erasing write procedure includes the step of applying, to the control terminals of the memory cells in the one memory block, voltages which are lower than the voltages applied to the control terminals of the memory cells in the one memory block for writing information having a highest threshold voltage in the program write procedure; and the step of performing the pre-erasing write verification procedure includes the step of using a reference voltage, which is lower than a reference voltage used in the program write verification procedure when information having the highest threshold voltage is written in the program write procedure.

* * * * *